United States Patent
Higashi et al.

(10) Patent No.: US 11,493,572 B2
(45) Date of Patent: Nov. 8, 2022

(54) MAGNETIC SENSOR

(71) Applicant: KABUSHIKI KAISHA TOSHIBA, Tokyo (JP)

(72) Inventors: Yoshihiro Higashi, Komatsu Ishikawa (JP); Akira Kikitsu, Yokohama Kanagawa (JP); Satoshi Shirotori, Yokohama Kanagawa (JP); Hitoshi Iwasaki, Tokyo (JP); Yoshinari Kurosaki, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 17/017,431

(22) Filed: Sep. 10, 2020

(65) Prior Publication Data
US 2021/0286029 A1 Sep. 16, 2021

(30) Foreign Application Priority Data
Mar. 11, 2020 (JP) .............................. JP2020-041864

(51) Int. Cl.
*G01R 33/09* (2006.01)

(52) U.S. Cl.
CPC ......... *G01R 33/096* (2013.01); *G01R 33/093* (2013.01); *G01R 33/098* (2013.01)

(58) Field of Classification Search
CPC .. G01R 33/096; G01R 33/093; G01R 33/098; G01R 33/0023; G01R 33/09
See application file for complete search history.

(56) References Cited

U.S. PATENT DOCUMENTS

| | | | |
|---|---|---|---|
| 7,504,927 B2 | 3/2009 | Shoji | |
| 7,852,070 B2 | 12/2010 | Yamada et al. | |
| 8,717,017 B2 | 5/2014 | Suzuki et al. | |
| 2014/0021943 A1* | 1/2014 | Watanabe | G01D 5/145 |
| | | | 324/207.21 |
| 2018/0081001 A1* | 3/2018 | Iwasaki | G01R 33/093 |
| (Continued) | | | |

FOREIGN PATENT DOCUMENTS

| | | |
|---|---|---|
| JP | 2006-162360 A | 6/2006 |
| JP | 2008-134215 A | 6/2008 |
| (Continued) | | |

*Primary Examiner* — Feba Pothen
(74) *Attorney, Agent, or Firm* — Finnegan, Henderson, Farabow, Garrett & Dunner, LLP

(57) ABSTRACT

According to one embodiment, a magnetic sensor includes a first conductive part circuit, an alternating current circuit part, a first direct current circuit part, and a first element. The first conductive part circuit includes a first conductive part including a first conductive part end portion and a first conductive part other-end portion, and a first alternating current transfer element electrically connected in series with the first conductive part. The first conductive part circuit includes a first circuit end portion and a first circuit other-end portion. The alternating current circuit part is configured to apply an alternating current voltage between the first circuit end portion and the first circuit other-end portion. The first direct current circuit part is configured to apply a first direct current voltage to the first conductive part end portion and the first conductive part other-end portion. The first element includes a first magnetic layer.

17 Claims, 9 Drawing Sheets

(56) References Cited

U.S. PATENT DOCUMENTS

| | | | |
|---|---|---|---|
| 2018/0271395 A1 | 9/2018 | Iwasaki et al. | |
| 2019/0237662 A1* | 8/2019 | Suzuki | H01P 1/218 |
| 2019/0369172 A1 | 12/2019 | Kikitsu et al. | |

FOREIGN PATENT DOCUMENTS

| | | |
|---|---|---|
| JP | 2010-197318 A | 9/2010 |
| JP | 2018-155719 A | 10/2018 |
| JP | 2019-207167 A | 12/2019 |

* cited by examiner

MAGNETIC SENSOR

CROSS-REFERENCE TO RELATED APPLICATIONS

This application is based upon and claims the benefit of priority from Japanese Patent Application No. 2020-041864, filed on Mar. 11, 2020; the entire contents of which are incorporated herein by reference.

FIELD

Embodiments of the invention generally relate to a magnetic sensor.

BACKGROUND

For example, there is a magnetic sensor that uses a magnetic layer. It is desirable to improve the characteristics of the magnetic sensor.

DETAILED DESCRIPTION

Figure 1A:
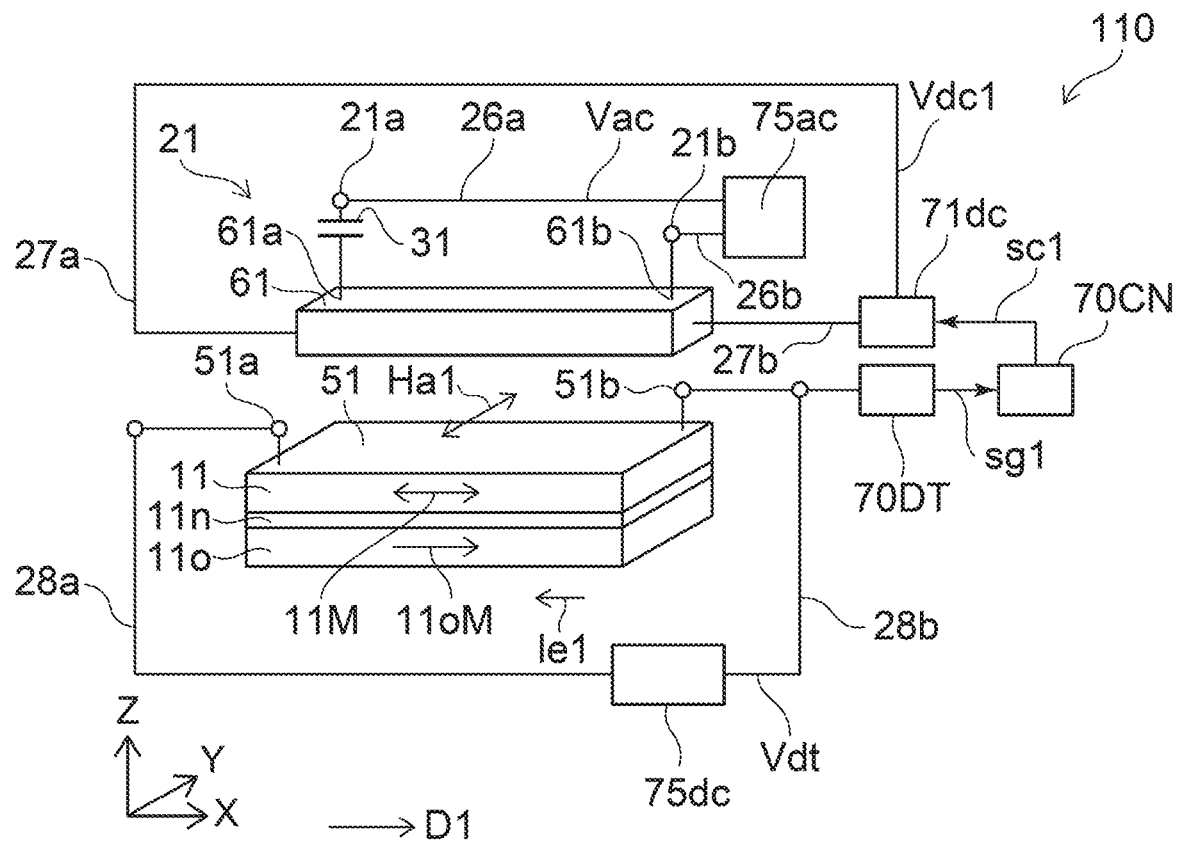
FIGS. 1A and 1B are schematic perspective views illustrating a magnetic sensor according to a first embodiment.

According to one embodiment, a magnetic sensor includes a first conductive part circuit, an alternating current circuit part, a first direct current circuit part, and a first element. The first conductive part circuit includes a first conductive part and a first alternating current transfer element. The first conductive part includes a first conductive part end portion and a first conductive part other-end portion. The first alternating current transfer element is electrically connected in series with the first conductive part. The first conductive part circuit includes a first circuit end portion and a first circuit other-end portion. The alternating current circuit part is configured to apply an alternating current voltage between the first circuit end portion and the first circuit other-end portion. The first direct current circuit part is configured to apply a first direct current voltage to the first conductive part end portion and the first conductive part other-end portion. The first element includes a first magnetic layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 1B:
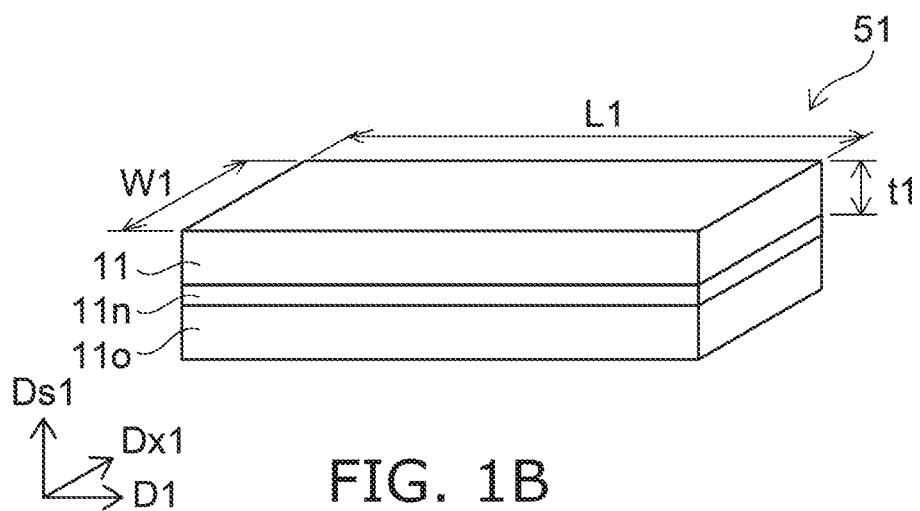

FIGS. 1A and 1B are schematic perspective views illustrating a magnetic sensor according to a first embodiment.

As shown in FIG. 1A, the magnetic sensor 110 according to the embodiment includes a first conductive part circuit 21, an alternating current circuit part 75ac, a first direct current circuit part 71dc, and a first element 51.

The first conductive part circuit 21 includes a first conductive part 61 and a first alternating current transfer element 31. The first alternating current transfer element 31 transfers the alternating current component of the signal and cuts (or attenuates) the direct current component of the signal. The first alternating current transfer element 31 is, for example, a capacitance element. The first alternating current transfer element 31 may include a circuit element including a switching element, etc. In the following example, the first alternating current transfer element 31 is taken as a first switching element.

The first conductive part 61 includes a first conductive part end portion 61a and a first conductive part other-end portion 61b. The first alternating current transfer element 31 is electrically connected in series with the first conductive part 61. The first conductive part circuit 21 includes a first circuit end portion 21a and a first circuit other-end portion 21b.

The alternating current circuit part 75ac is configured to apply an alternating current voltage Vac between the first circuit end portion 21a and the first circuit other-end portion 21b. In the example, the alternating current circuit part 75ac is electrically connected to the first circuit end portion 21a and the first circuit other-end portion 21b by a conductive part 26a and a conductive part 26b.

The first direct current circuit part 71dc is configured to apply a first direct current voltage Vdc1 to the first conductive part end portion 61a and the first conductive part other-end portion 61b. In the example, the first direct current circuit part 71dc is electrically connected to the first conductive part end portion 61a and the first conductive part other-end portion 61b by a conductive part 27a and a conductive part 27b.

The first element 51 includes a first magnetic layer 11. For example, the first element 51 further includes a first counter magnetic layer 11o and a first nonmagnetic layer 11n. The first nonmagnetic layer 11n is provided between the first magnetic layer 11 and the first counter magnetic layer 11o. The electrical resistance of the first element 51 changes according to the magnetic field applied to the first element 51. For example, the change of the electrical resistance is based on a magnetoresistance effect.

For example, the first magnetic layer 11 includes a magnetization 11M. The first counter magnetic layer 11o includes a magnetization 11oM. In one example, the orientation of the magnetization 11oM is substantially fixed. The orientation of the magnetization 11M of the first magnetic layer 11 changes when a magnetic field is applied to the first element 51. The angle between the magnetization 11oM and the magnetization 11M changes according to the applied magnetic field. The electrical resistance changes according to the change of the angle. The first element 51 is, for example, a GMR (giant magnetic resistance) element or a TMR (tunnel magneto resistance effect) element. In one example, the magnetization 11M of the first magnetic layer 11 is along the magnetization 11oM of the first counter magnetic layer 11o when there is substantially no external magnetic field. An even-function characteristic is easily obtained in the first element 51. In the embodiment, the first element 51 may be an AMR (anisotropic magnetoresistance effect) element.

As shown in FIG. 1A, for example, the magnetic sensor 110 may further include a detection circuit part 70DT. The detection circuit part 70DT is configured to output a signal sg1 corresponding to the electrical resistance (e.g., a first electrical resistance) of the first element 51. For example, the first element 51 includes a first element end portion 51a and a first element other-end portion 51b. The electrical resistance of the first element 51 corresponds to the electrical resistance between the first element end portion 51a and the first element other-end portion 51b.

As shown in FIG. 1A, a detection voltage circuit part 75dc may be provided. The detection voltage circuit part 75dc is configured to apply a detection voltage Vdt between the first element end portion 51a and the first element other-end portion 51b. For example, the detection voltage circuit part 75dc is electrically connected to the first element end portion 51a and the first element other-end portion 51b by a conductive part 28a and a conductive part 28b. A detection current (e.g., a first element current Ie1) flows in the first element 51 due to the detection voltage Vdt. For example, the detection circuit part 70DT is configured to detect a voltage or the like corresponding to the change of the detection current. Thereby, the detection circuit part 70DT is configured to output a signal sg1 corresponding to the electrical resistance of the first element 51. For example, it is sufficient for the detection voltage Vdt to be a substantially direct current voltage. It is sufficient for a current that is substantially direct current to flow in the first element 51 due to the detection voltage Vdt.

In the embodiment, such a first element 51 and such a first conductive part 61 are combined. An alternating current flows in the first conductive part 61 according to the alternating current voltage applied to the first conductive part 61. A first alternating current magnetic field Ha1 that corresponds to the alternating current flowing in the first conductive part 61 is applied to the first element 51. The magnetic field to be detected (the detected magnetic field) and the first alternating current magnetic field Ha1 are applied to the first element 51.

As described below, for example, the magnetic field-electrical resistance characteristic of the first element 51 is a substantially even function. In such a case, the electrical resistance of the first element 51 has a component of a frequency that is 2 times a frequency f of the first alternating current magnetic field Ha1 and a component of the frequency f. When the magnetic field is based on direct current, the magnitude of the frequency f component corresponds to the magnitude of the detected magnetic field. Information that relates to the detected magnetic field can be obtained by extracting the frequency f component from the signal sg1 corresponding to the electrical resistance of the first element 51. When the magnetic field is based on alternating current and the frequency of the detected magnetic field is fex, the signal after the modulation of the electrical resistance of the first element 51 includes a frequency of f±fex. The intensity of the frequency component of f±fex in the signal after the modulation changes according to the intensity of the detected magnetic field. Information that relates to the detected magnetic field can be obtained by extracting the frequency component of f±fex from the signal sg1.

In one example, there are cases where the magnetic field-electrical resistance characteristic of the first element 51 is shifted from the ideal even function. For example, there are cases where the characteristics of the magnetic layers included in the first element 51, the characteristics of the first conductive part 61, the positional relationship between the first element 51 and the first conductive part 61, etc., deviate from the design state due to fluctuation of the manufacturing conditions, etc. Thereby, there is a possibility that the magnetic field-electrical resistance characteristic of the first element 51 may shift from the ideal even function.

In the embodiment, the first alternating current transfer element 31 is provided in the first conductive part circuit 21 that includes the first conductive part 61. The alternating current voltage Vac is applied to the first conductive part circuit 21 by the alternating current circuit part 75ac. For example, the alternating current voltage Vac passes through the first alternating current transfer element 31 due to capacitive coupling and is applied to the first conductive part 61. On the other hand, the first direct current circuit part 71dc is configured to apply the first direct current voltage Vdc1 to the first conductive part 61. For example, when the magnetic field-electrical resistance characteristic of the first element 51 is shifted from the ideal even function, the magnetic field-electrical resistance characteristic of the first element 51 can be caused to approach the ideal even function by the first direct current circuit part 71dc applying the first direct current voltage Vdc1 of the appropriate value to the first conductive part 61. A signal of the frequency caused by the asymmetry can be suppressed thereby.

Thereby, the detected magnetic field can be detected with higher precision. For example, the detected magnetic field can be detected with a high dynamic range. According to the embodiment, a magnetic sensor can be provided in which the characteristics can be improved.

As shown in FIG. 1A, the magnetic sensor 110 may further include a control circuit part 70CN. The signal sg1 that is output from the detection circuit part 70DT is supplied to the control circuit part 70CN. The control circuit part 70CN may be configured to control the first direct current circuit part 71dc based on the signal sg1. For example, a first control signal sc1 is supplied from the control circuit part 70CN to the first direct current circuit part 71dc. The first direct current voltage Vdc1 that is output from the first direct current circuit part 71dc is controlled based on the first control signal sc1. The control circuit part 70CN controls the first direct current voltage Vdc1 to cause the electrical resistance (e.g., the first electrical resistance) of the first element 51 to approach an even function of the current (e.g., a first current) flowing in the first conductive part 61.

As shown in FIG. 1A, the direction from the first counter magnetic layer 11o toward the first magnetic layer 11 is taken as a Z-axis direction. One direction perpendicular to the Z-axis direction is taken as an X-axis direction. A direction perpendicular to the Z-axis direction and the X-axis direction is taken as a Y-axis direction. The Z-axis direction corresponds to the stacking direction of the first counter magnetic layer 11o and the first magnetic layer 11.

In one example, the direction from the first element 51 toward the first conductive part 61 is along the Z-axis direction. The direction from the first element 51 toward the first conductive part 61 may be along the Y-axis direction.

By such an arrangement, the first alternating current magnetic field Ha1 that is generated from the first conductive part 61 is easily applied efficiently to the first element 51.

As shown in FIG. 1A, the direction from the first conductive part end portion 61a toward the first conductive part other-end portion 61b is along a first direction D1. For example, the first direction D1 is along the X-axis direction. For example, it is favorable for the magnetization 11M of the first magnetic layer 11 to be along the first direction D1. The even-function characteristic is obtained more easily thereby. For example, when there is no magnetic field from the outside, it is more favorable for the magnetization 11M and the magnetization 11oM to be along the first direction D1. The even-function characteristic is obtained more easily.

As shown in FIG. 1B, the length along the first direction D1 of the first magnetic layer 11 is taken as a length L1. The length along a first cross direction Dx1 of the first magnetic layer 11 is taken as a length W1. For example, the length W1 corresponds to the width. The length along a first other direction Ds1 of the first magnetic layer 11 is taken as a length t1. For example, the length t1 corresponds to the thickness. In one example, the first cross direction Dx1 is the Y-axis direction. In one example, the first other direction Ds1 is the Z-axis direction.

For example, the length L1 is greater than the length W1. For example, the length W1 is greater than the length t1. By such a configuration, the magnetization 11M of the first magnetic layer 11 is easily along the first direction D1. For example, such a control of the magnetization 11M is due to the effect of shape anisotropy. Because the magnetization 11M is along the first conductive part 61, an even-function characteristic or a characteristic close to an even function is obtained more easily.

Figure 2A:
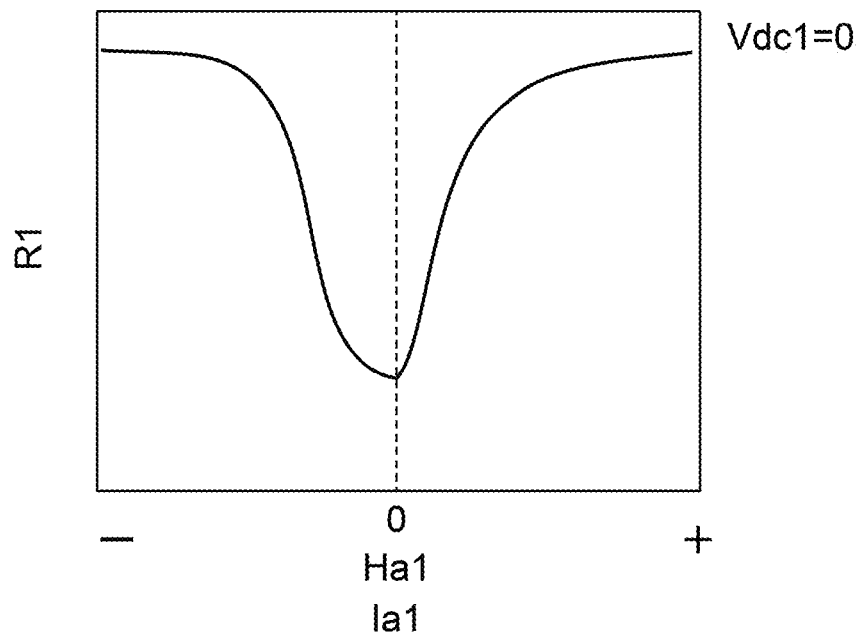
FIGS. 2A and 2B are schematic views illustrating a characteristic of the magnetic sensor.
Figure 2B:
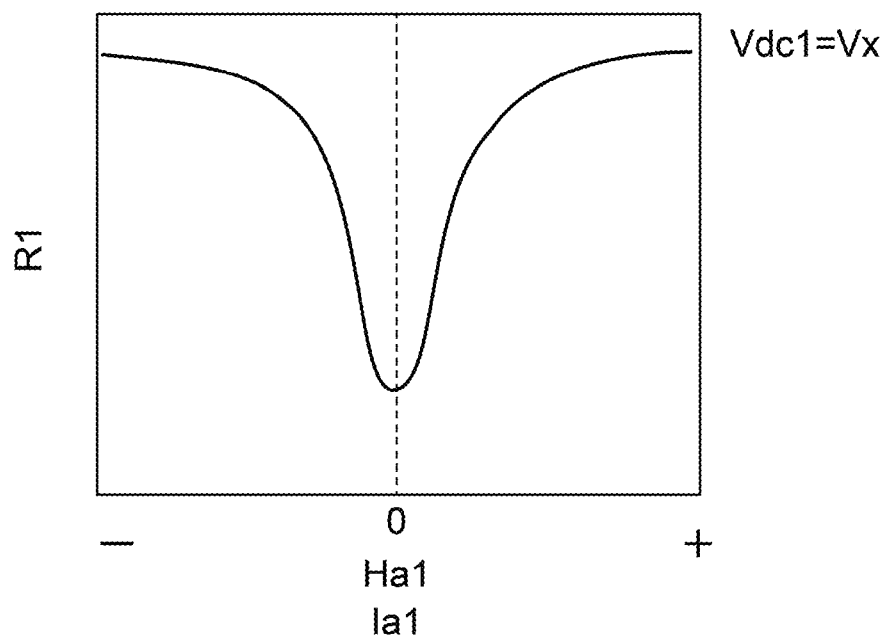

FIGS. 2A and 2B are schematic views illustrating a characteristic of the magnetic sensor.

In FIGS. 2A and 2B, the horizontal axis is the current (the first current Ia1) flowing in the first conductive part 61. In FIGS. 2A and 2B, the vertical axis is the electrical resistance (a first electrical resistance R1) of the first element 51. FIG. 2A corresponds to when the first direct current voltage Vdc1 is 0. FIG. 2B corresponds to when the first direct current voltage Vdc1 is a voltage Vx. In FIGS. 2A and 2B, the horizontal axis corresponds to the magnetic field (the first alternating current magnetic field Ha1) generated based on the first current Ia1. In these figures, "+" and "−" correspond to the polarity of the first current Ia1 and correspond to the orientation of the first current Ia1. "+" and "−" correspond to the orientation of the first alternating current magnetic field Ha1.

As shown in FIG. 2A, the first electrical resistance R1 of the first element 51 increases as the absolute value of the first current Ia1 increases when the first current Ia1 flowing in the first conductive part 61 is positive. The first electrical resistance R1 increases as the absolute value of the first current Ia1 increases when the first current Ia1 flowing in the first conductive part 61 is negative. The first electrical resistance R1 is a substantially even function of the first current Ia1. However, in one example in which the first direct current voltage Vdc1 is 0 as shown in FIG. 2A, the first electrical resistance R1 is asymmetric with respect to the change of the first current Ia1. It is considered that such an asymmetry is caused by fluctuation of the characteristics of the first element 51, the characteristics of the first conductive part 61, the positional relationship between the first element 51 and the first conductive part 61, etc.

As shown in FIG. 2B, the first electrical resistance R1 is substantially symmetric with respect to the change of the first current Ia1 when the first direct current voltage Vdc1 is the appropriate voltage Vx. The noise that is caused by the asymmetry can be suppressed thereby. For example, the first electrical resistance R1 approaches the even function when the first direct current voltage Vdc1 output from the first direct current circuit part 71dc is the appropriate voltage Vx. Or, the first electrical resistance R1 becomes a perfect even function.

Such a voltage Vx may be obtained by the control of the control circuit part 70CN. For example, the control circuit part 70CN controls the first direct current voltage Vdc1 based on the signal sg1 output from the detection circuit part 70DT to cause the first electrical resistance R1 to approach an even function of the first current Ia1.

As shown in FIG. 2A, the first electrical resistance R1 of the first element 51 increases as the absolute value of the first alternating current magnetic field Ha1 increases when the first alternating current magnetic field Ha1 applied to the first element 51 is positive. The first electrical resistance R1 increases as the absolute value of the first alternating current magnetic field Ha1 increases when the first alternating current magnetic field Ha1 applied to the first element 51 is negative. For example, the control circuit part 70CN may control the first direct current voltage Vdc1 based on the signal sg1 output from the detection circuit part 70DT to cause the first electrical resistance R1 to approach an even function of the first alternating current magnetic field Ha1.

The example of the characteristics of the first element 51 when the electrical resistance of the first element 51 is a substantially even function of the applied magnetic field will now be described.

Figure 3:
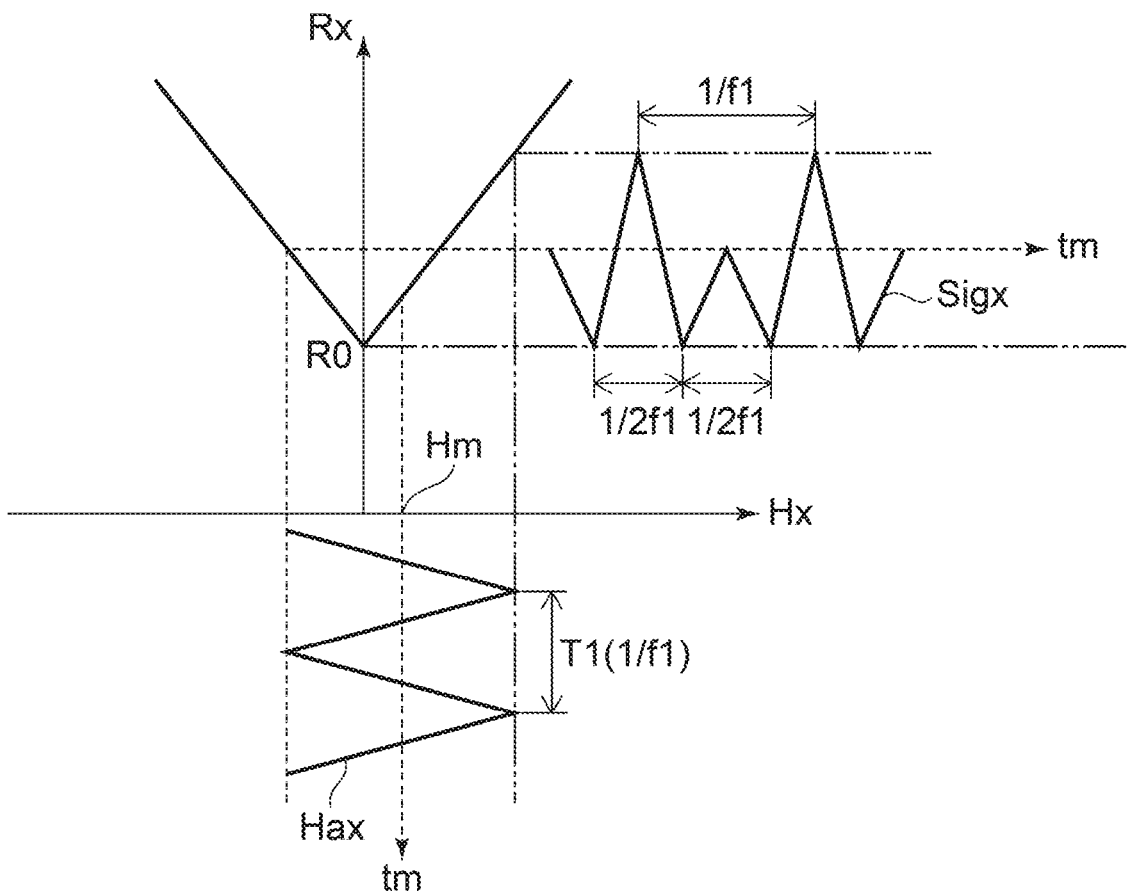
FIG. 3 is a graph illustrating the characteristics of the magnetic sensor.

FIG. 3 is a graph illustrating the characteristics of the magnetic sensor.

FIG. 3 illustrates the characteristics when an alternating current magnetic field Hax and a magnetic field Hm are applied as a magnetic field Fix to an element (e.g., the first element 51). The magnetic field Hm is the magnetic field to be detected. The horizontal axis of FIG. 3 corresponds to the magnetic field Hx. The vertical axis corresponds to a resistance Rx of the element. For example, the resistance Rx corresponds to the signal sg1 output from the detection circuit part 70DT. The alternating current magnetic field Hax changes with respect to a time tm. In the example of FIG. 3, the alternating current magnetic field Hax is a triangular wave. The alternating current magnetic field Hax may be a sine wave, a pulse wave, etc. The frequency of the alternating current magnetic field Hax is taken as a first frequency f1. The resistance Rx has the even-function characteristic with respect to the magnetic field Hx.

As shown in FIG. 3, for example, a signal Sigx is obtained from the element when the alternating current magnetic field Hax and the magnetic field Hm are applied. The signal Sigx corresponds to the change of the resistance Rx. In the signal Sigx, a waveform that has two types of frequency components referenced to a resistance R0 is obtained. For example, the signal Sigx corresponds to the signal sg1 output from the detection circuit part 70DT.

The signal Sigx (the resistance Rx) changes with respect to the time tm. The signal Sigx (the resistance Rx) includes a first frequency f1 component and a double frequency 2f1 component. The waveform component that corresponds to the first frequency f1 is caused by the magnetic field Hm. When the magnetic field Hm is 0, peaks that correspond to the first frequency f1 are substantially not generated, and the double frequency 2f1 component is generated. For example, the component that corresponds to the first frequency f1 can be extracted using a filter, etc. The magnetic field Hm to be detected can be known by measuring the intensity of the peak corresponding to the first frequency f1. For example, the signal of the double frequency 2f1 corresponds to an unnecessary signal (e.g., noise).

The magnetic field Hm may be a direct current magnetic field or an alternating current magnetic field. When the magnetic field Hm is an alternating current magnetic field, the frequency of the magnetic field Hm is less than the frequency (the first frequency f1) of the alternating current magnetic field Hax.

In the embodiment, the resistance Rx has a substantially even-function characteristic with respect to the magnetic field Hx due to the control of the first direct current voltage Vdc1. The noise that is caused by the asymmetry can be suppressed. The magnetic field Hm to be detected can be detected more accurately thereby.

As described above, the alternating current voltage Vac has the first frequency f1. The control circuit part 70CN is configured to control the first direct current voltage Vdc1 to reduce the first frequency f1 component of the signal sg1 output from the detection circuit part 70DT when there is substantially no external magnetic field. Thereby, the resistance Rx is a substantially even function of the magnetic field Hx when there is substantially no external magnetic field. Then, the first frequency f1 component corresponds to the magnetic field Hm to be detected.

Second Embodiment

Figure 4A:
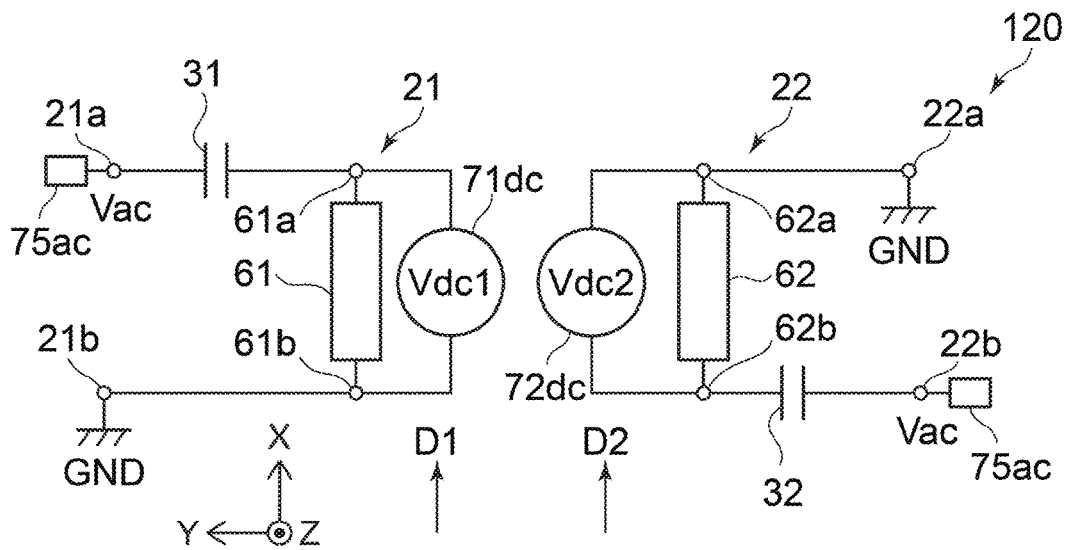
FIGS. 4A to 4C are schematic views illustrating a magnetic sensor according to a second embodiment.
Figure 4B:
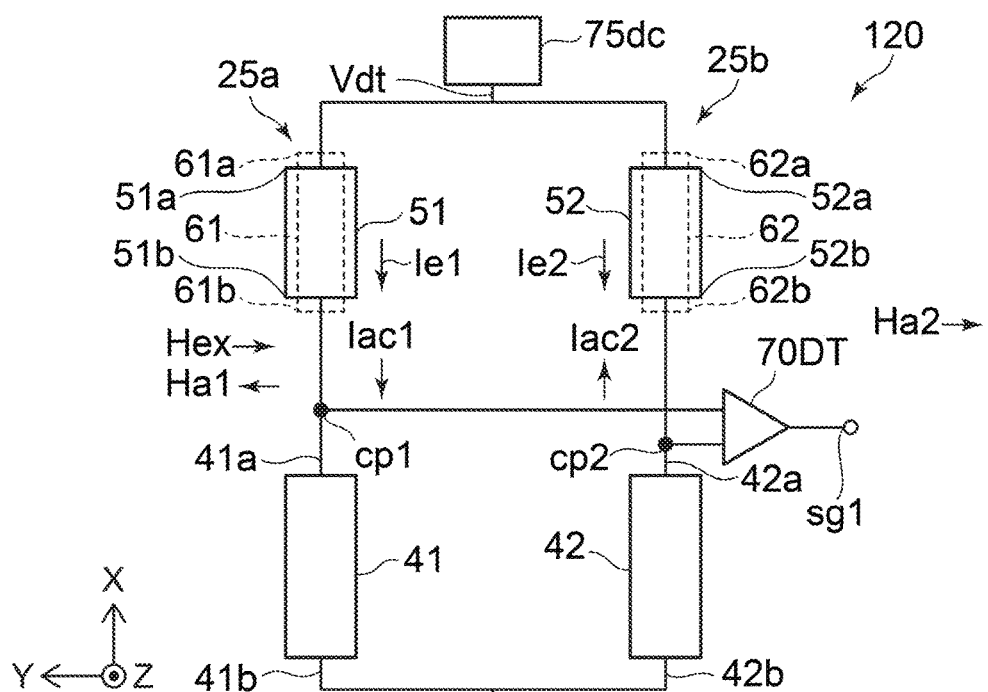
Figure 4C:
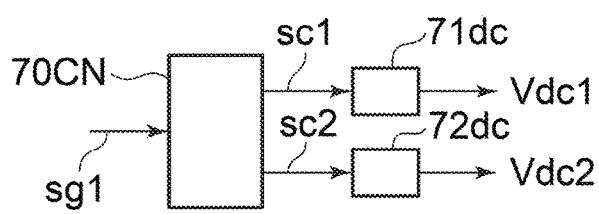
Figure 5:
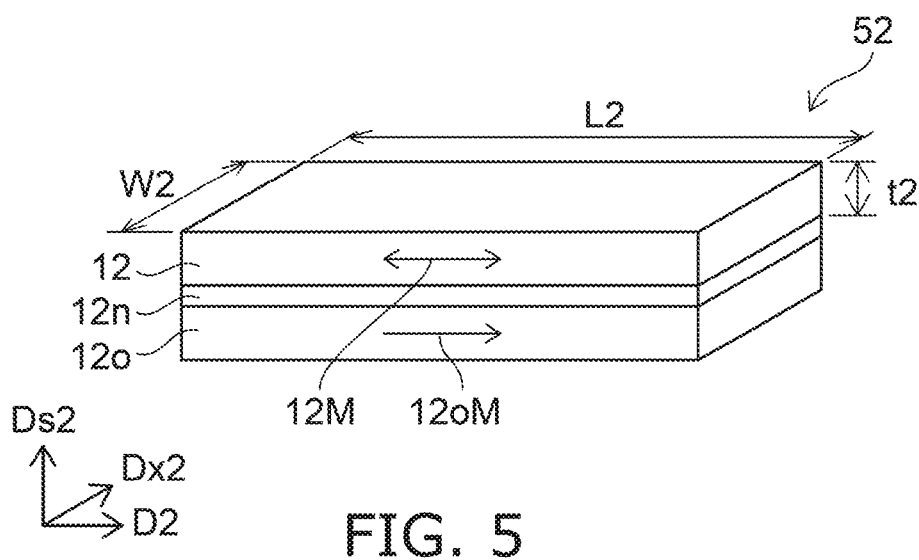
FIG. 5 is a schematic perspective view illustrating the magnetic sensor according to the second embodiment.

FIGS. 4A to 4C are schematic views illustrating a magnetic sensor according to a second embodiment. FIG. 5 is a schematic perspective view illustrating the magnetic sensor according to the second embodiment.

As shown in FIGS. 4A to 4C, the magnetic sensor 120 according to the second embodiment includes a second conductive part circuit 22, a second element 52, a first resistance element 41, a second resistance element 42, and the detection voltage circuit part 75dc in addition to the first conductive part circuit 21, the alternating current circuit part 75ac, the first direct current circuit part 71dc, and the first element 51.

The second conductive part circuit 22 includes a second conductive part 62 and a second alternating current transfer element 32. The second alternating current transfer element 32 transfers the alternating current component of the signal and cuts (or attenuates) the direct current component of the signal. The second alternating current transfer element 32 is, for example, a capacitance element. The second alternating current transfer element 32 may include a circuit element including a switching element, etc. In the following example, the second alternating current transfer element 32 is taken as a second switching element.

The second conductive part 62 includes a second conductive part end portion 62a and a second conductive part other-end portion 62b. The second alternating current transfer element 32 is electrically connected in series with the second conductive part 62. The second conductive part circuit 22 includes a second circuit end portion 22a and a second circuit other-end portion 22b.

A second direct current circuit part 72dc is configured to apply a second direct current voltage Vdc2 between the second conductive part end portion 62a and the second conductive part other-end portion 62b.

As shown in FIG. 5, the second element 52 includes a second magnetic layer 12. In the example, the second element 52 further includes a second counter magnetic layer 12o and a second nonmagnetic layer 12n. The second nonmagnetic layer 12n is provided between the second magnetic layer 12 and the second counter magnetic layer 12o. The electrical resistance of the second element 52 changes according to a magnetic field applied to the second element 52. For example, the change of the electrical resistance is based on a magnetoresistance effect.

As shown in FIG. 4A, the alternating current circuit part 75ac is configured to apply the alternating current voltage Vac between the second circuit end portion 22a and the second circuit other-end portion 22b. In one example as shown in FIG. 4A, the polarity (the phase) of the alternating current voltage Vac applied in the second conductive part circuit 22 is the reverse of the polarity (the phase) of the alternating current voltage Vac applied in the first conductive part circuit 21.

In one example as shown in FIG. 4B, the first conductive part 61 overlaps the first element 51 in the Z-axis direction. The second conductive part 62 overlaps the second element 52 in the Z-axis direction.

As shown in FIG. 4B, the first element 51, the first resistance element 41, the second element 52, and the second resistance element 42 form a bridge circuit (e.g., a Wheatstone bridge). The detection voltage circuit part 75dc is configured to apply the detection voltage Vdt to the bridge circuit. For example, it is sufficient for the detection voltage Vdt to be a substantially direct current voltage. It is sufficient for a current that is substantially direct current to flow in the first and second elements 51 and 52 due to the detection voltage Vdt.

The detection circuit part 70DT is configured to output the signal sg1 corresponding to the difference between the potential of an electrical first connection point cp1 of the first element 51 and the first resistance element 41 and the potential of an electrical second connection point cp2 of the second element 52 and the second resistance element 42.

As shown in FIG. 4C, the signal sg1 that is output from the detection circuit part 70DT is supplied to the control circuit part 70CN. The control circuit part 70CN is configured to control at least one of the first direct current voltage Vdc1 or the second direct current voltage Vdc2 based on the signal sg1. For example, the first control signal sc1 is supplied from the control circuit part 70CN to the first direct current circuit part 71dc. The first direct current voltage Vdc1 that corresponds to the first control signal sc1 is output from the first direct current circuit part 71dc. A second control signal sc2 is supplied from the control circuit part 70CN to the second direct current circuit part 72dc. The second direct current voltage Vdc2 that corresponds to the second control signal sc2 is output from the second direct current circuit part 72dc.

In the magnetic sensor 120, the same alternating current voltage Vac is applied to the first and second conductive parts 61 and 62. Thereby, a shift substantially does not occur in the alternating current components of the magnetic fields generated from the first and second conductive parts 61 and 62. Mutually-independent direct current voltages can be applied to the first conductive part circuit 21 and the second conductive part circuit 22. Thereby, the characteristics of each of the first and second elements 51 and 52 can be controlled to approach even functions independently. The noise that is caused by the asymmetry can be suppressed. A magnetic sensor can be provided in which the characteristics can be improved.

As shown in FIG. 4B, the first resistance element 41 is electrically connected in series with the first element 51. The second resistance element 42 is electrically connected in series with the second element 52. A first element circuit 25a that includes the first element 51 and the first resistance element 41 and a second element circuit 25b that includes the second element 52 and the second resistance element 42 are electrically connected in parallel. The detection voltage circuit part 75dc applies the detection voltage Vdt to the first and second element circuits 25a and 25b.

For example, the first resistance element 41 includes a first resistance element end portion 41a and a first resistance element other-end portion 41b. The first resistance element end portion 41a is electrically connected to the first element other-end portion 51b. The first element end portion 51a is electrically connected to the detection voltage circuit part 75dc. For example, the first resistance element other-end portion 41b is electrically connected to the detection voltage circuit part 75dc via a ground GND. For example, the potential of the first connection point cp1 corresponds to the potentials of the first resistance element end portion 41a and the first element other-end portion 51b.

For example, the second resistance element 42 includes a second resistance element end portion 42a and a second resistance element other-end portion 42b. The second resistance element end portion 42a is electrically connected to a second element other-end portion 52b. A second element end portion 52a is electrically connected to the detection voltage circuit part 75dc. For example, the second resistance element other-end portion 42b is electrically connected to the detection voltage circuit part 75dc via the ground GND. For example, the potential of the second connection point cp2 corresponds to the potentials of the second resistance element end portion 42a and the second element other-end portion 52b.

As shown in FIG. 4B, the first element current Ie1 flows through the first element 51 and the first resistance element 41 based on the detection voltage Vdt applied by the detection voltage circuit part 75dc. A second element current Ie2 flows through the second element 52 and the second resistance element 42 based on the detection voltage Vdt. For example, it is sufficient for the first element current Ie1 and the second element current Ie2 to be currents that are substantially direct currents.

As shown in FIG. 46, a first alternating current Iac1 flows through the first conductive part 61 based on the alternating current voltage Vac. A second alternating current Iac2 flows through the second conductive part 62 based on the alternating current voltage Vac.

As shown in FIG. 4B, it is possible to apply an external magnetic field Hex to the first and second elements 51 and 52. FIG. 4B illustrates the state at one time. For at least one time, the phase of the first alternating current Iac1 referenced to the orientation of the external magnetic field Hex applied to the first element 51 is the reverse of the phase of the second alternating current Iac2 referenced to the orientation of the external magnetic field Hex applied to the second element 52.

In the example, the external magnetic field Hex that has one orientation is applied to the first and second elements 51 and 52 at one time. At this time, the orientation of the first alternating current Iac1 flowing in the first conductive part 61 is the reverse of the orientation of the second alternating current Iac2 flowing in the second conductive part 62.

As shown in FIG. 4B, for example, the first alternating current magnetic field Ha1 is applied to the first element 51 based on the first alternating current Iac1. A second alternating current magnetic field Ha2 is applied to the second element 52 based on the second alternating current Iac2. At one time, the orientation of the first alternating current magnetic field Ha1 is the reverse of the orientation of the external magnetic field Hex, and the orientation of the second alternating current magnetic field Ha2 is the same as the orientation of the external magnetic field Hex.

Due to the reverse phase, the change of the electrical resistance of the first element 51 corresponding to the first alternating current magnetic field Ha1 and the change of the electrical resistance of the second element 52 corresponding to the second alternating current magnetic field Ha2 substantially cancel. Thereby, the frequency component that is caused by these alternating current magnetic fields can be small. The magnetic field to be detected is easily detected efficiently.

As shown in FIG. 4B, for example, the distance between the first conductive part 61 and the first element 51 is less than the distance between the first conductive part 61 and the second element 52. The distance between the second conductive part 62 and the second element 52 is less than the distance between the second conductive part 62 and the first element 51. The first alternating current magnetic field Ha1 that is generated by the first conductive part 61 is applied to the first element 51 and is substantially not applied to the second element 52. The second alternating current magnetic field Hat that is generated by the second conductive part 62 is applied to the second element 52 and is substantially not applied to the first element 51.

The first element 51 includes the first element end portion 51a and the first element other-end portion 51b. The distance between the first element end portion 51a and the first conductive part end portion 61a is less than the distance between the first element end portion 51a and the first conductive part other-end portion 61b. The distance between the first element other-end portion 51b and the first conductive part other-end portion 61b is less than the distance between the first element other-end portion 51b and the first conductive part end portion 61a. The second element 52 includes the second element end portion 52a and the second element other-end portion 52b. The distance between the second element end portion 52a and the second conductive part end portion 62a is less than the distance between the second element end portion 52a and the second conductive part other-end portion 62b. The distance between the second element other-end portion 52b and the second conductive part other-end portion 62b is less than the distance between the second element other-end portion 52b and the second conductive part end portion 62a.

Figure 6A:
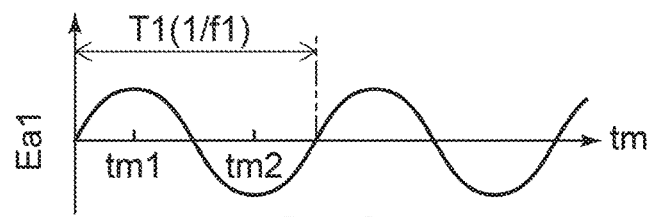
FIGS. 6A to 6F are schematic views illustrating the magnetic sensor according to the second embodiment.
Figure 6B:
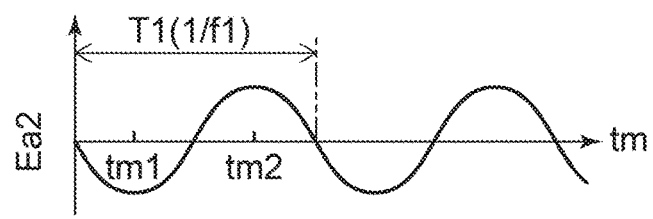
Figure 6C:
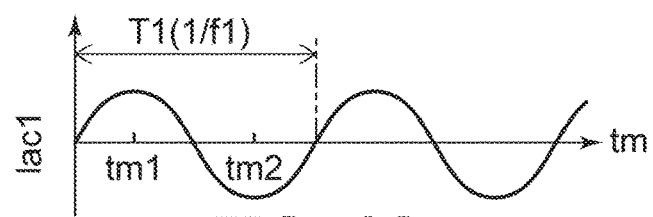
Figure 6D:
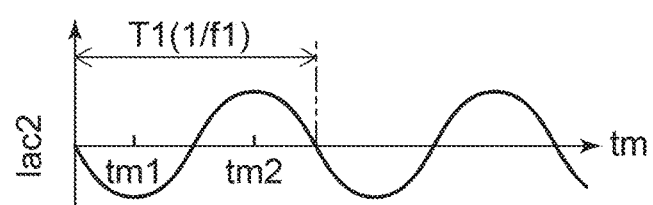
Figure 6E:
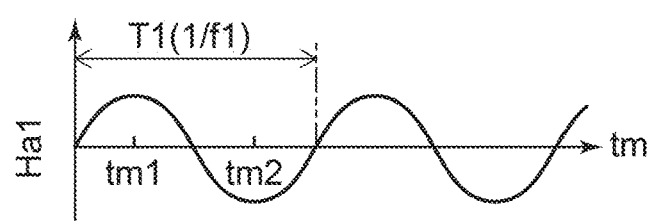
Figure 6F:
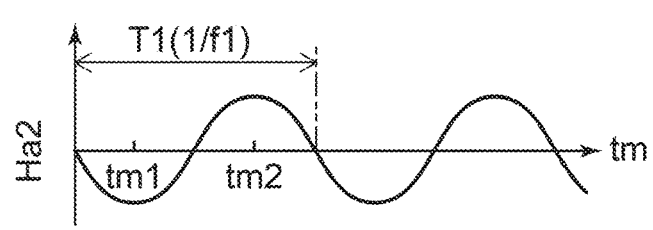

FIGS. 6A to 6F are schematic views illustrating the magnetic sensor according to the second embodiment. In these figures, the horizontal axis is the time tm. The vertical axis of FIG. 6A is a potential Ea1 of the first conductive part end portion 61a referenced to the first conductive part other-end portion 61b. The vertical axis of FIG. 6B is a potential Ea2 of the second conductive part end portion 62a referenced to the second conductive part other-end portion 62b. The vertical axis of FIG. 6C is the first alternating current Iac1. The vertical axis of FIG. 6D is the second alternating current Iac2. The vertical axis of FIG. 6E is the first alternating current magnetic field Ha1. The vertical axis of FIG. 6F is the second alternating current magnetic field Hat.

As shown in FIG. 6A, the potential Ea1 is positive at a first time tm1. The potential of the first conductive part end portion 61a is greater than the potential of the first conductive part other-end portion 61b at the first time tm1. The potential Ea2 is negative at a second time tm2. The potential of the first conductive part end portion 61a is less than the potential of the first conductive part other-end portion 61b at the second time tm2.

As shown in FIG. 6B, the potential Ea2 is negative at the first time tm1. The potential of the second conductive part end portion 62a is less than the potential of the second conductive part other-end portion 62b at the first time tm1. The potential Ea2 is positive at the second time tm2. The potential of the second conductive part end portion 62a is greater than the potential of the second conductive part other-end portion 62b at the second time tm2.

Substantially direct current voltages are applied by the detection voltage circuit part 75dc to the first and second elements 51 and 52 at such a first time tm1 and such a second time tm2. The first element current Ie1 (referring to FIG. 4B), which is substantially direct current, flows in the first element 51. The second element current Ie2 (referring to FIG. 4B), which is substantially direct current, flows in the second element 52. Accordingly, the orientation of the current (the first element current Ie1) flowing through the first element 51 at the first time tm1 is the same as the orientation of the current (the first element current Ie1) flowing through the first element 51 at the second time tm2. Similarly, the orientation of the current (the second element current Ie2) flowing through the second element 52 at the first time tm1 is the same as the orientation of the current (the second element current Ie2) flowing through the second element 52 at the second time tm2.

As shown in FIG. 4B, the first element current Ie1 flows through the first element 51 from the first element end portion 51a toward the first element other-end portion 51b at the first and second times tm1 and tm2. The second element current Ie2 flows through the second element 52 from the second element end portion 52a toward the second element other-end portion 52b at the first and second times tm1 and tm2.

As shown in FIG. 6C, for example, the first alternating current Iac1 is positive at the first time tm1. The first alternating current Iac1 is negative at the second time tm2. As shown in FIG. 6D, for example, the second alternating current Iac2 is negative at the first time tm1. The second alternating current Iac2 is positive at the second time tm2.

As shown in FIG. 6E, for example, the first alternating current magnetic field Ha1 is positive at the first time tm1. The first alternating current magnetic field Ha1 is negative at the second time tm2. As shown in FIG. 6F, for example, the second alternating current magnetic field Ha2 is negative at the first time tm1. The second alternating current magnetic field Ha2 is positive at the second time tm2.

In one example as shown in FIG. 4A, the direction from the second conductive part other-end portion 62b toward the second conductive part end portion 62a is along a second direction D2. In the example, the second direction D2 is along the first direction D1.

As shown in FIG. 5, the length along the second direction D2 of the second magnetic layer 12 is taken as a length L2. The length along a second cross direction Dx2 of the second magnetic layer 12 is taken as a length W2. The second cross direction Dx2 crosses the second direction D2. The length along a second other direction Ds2 of the second magnetic layer 12 is taken as a length t2. The second other direction Ds2 crosses a plane including the second direction D2 and the second cross direction Dx2. In one example, for example, the second direction D2 is along the X-axis direction. For example, the second cross direction Dx2 is along the Y-axis direction. For example, the second other direction Ds2 is along the Z-axis direction.

For example, the length L2 is greater than the length W2. The length W2 is greater than the length t2. Due to such a length relationship, a magnetization 12M of the second magnetic layer 12 is easily along the second direction D2. An even-function characteristic is easily obtained.

As shown in FIG. 5, the second element 52 includes, for example, the second magnetic layer 12, the second counter magnetic layer 12o, and the second nonmagnetic layer 12n. The second nonmagnetic layer 12n is provided between the second magnetic layer 12 and the second counter magnetic layer 12o. For example, the magnetization 12M of the second magnetic layer 12 is along a magnetization 12oM of the second counter magnetic layer 12o when there is substantially no external magnetic field.

In the second embodiment, at least one of the first resistance element 41 or the second resistance element 42 may include a magnetic layer.

Third Embodiment

Figure 7A:
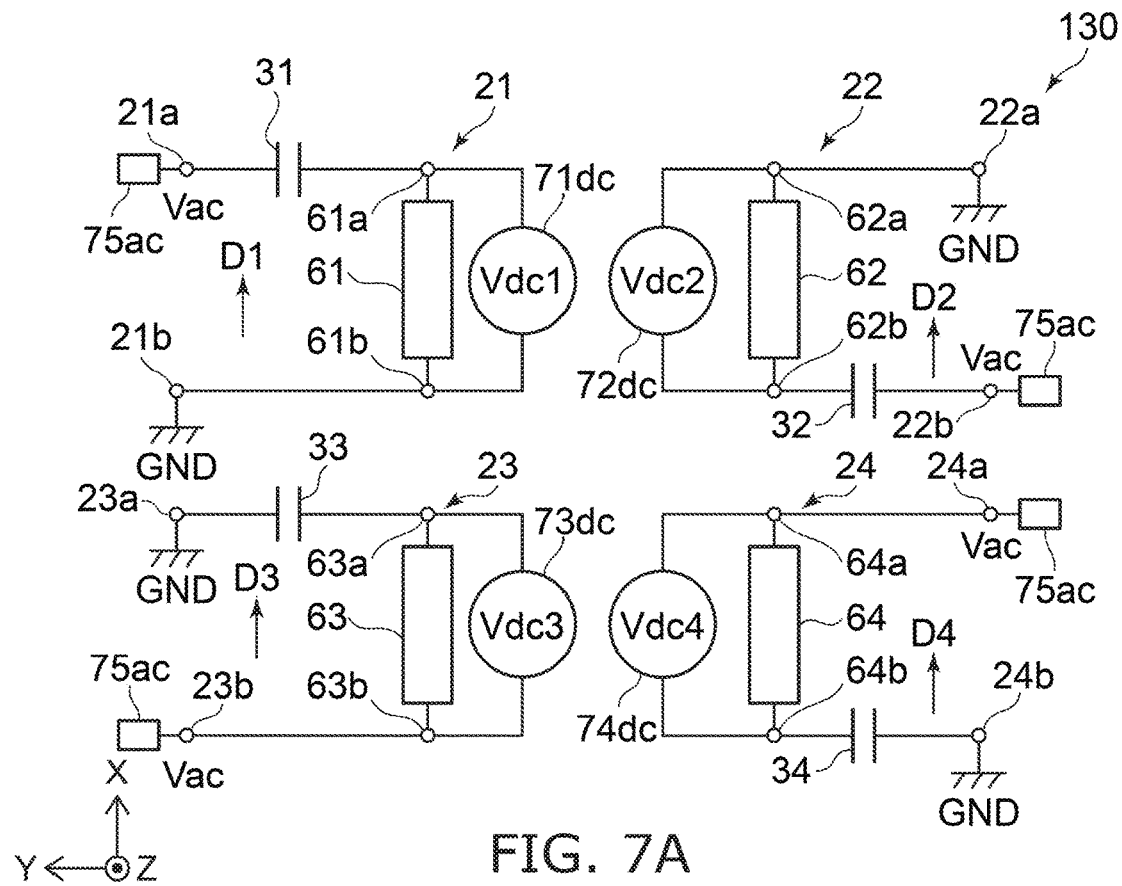
FIGS. 7A and 7B are schematic views illustrating a magnetic sensor according to a third embodiment.
Figure 7B:
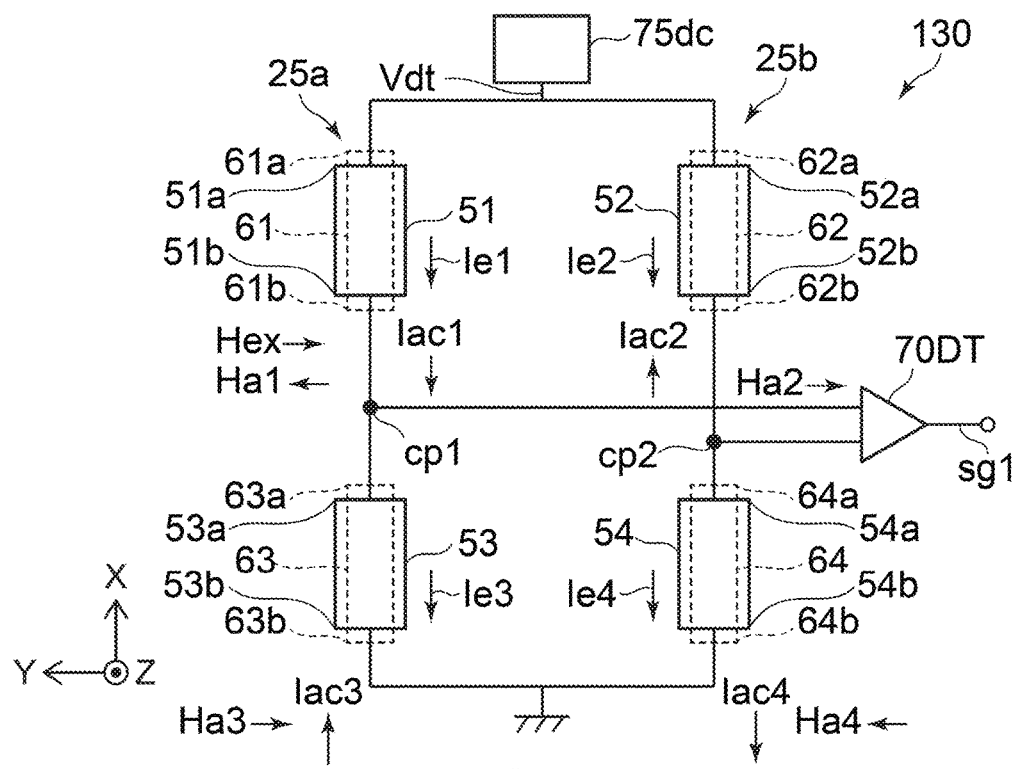

FIGS. 7A and 7b are schematic views illustrating a magnetic sensor according to a third embodiment.

Figure 8A:
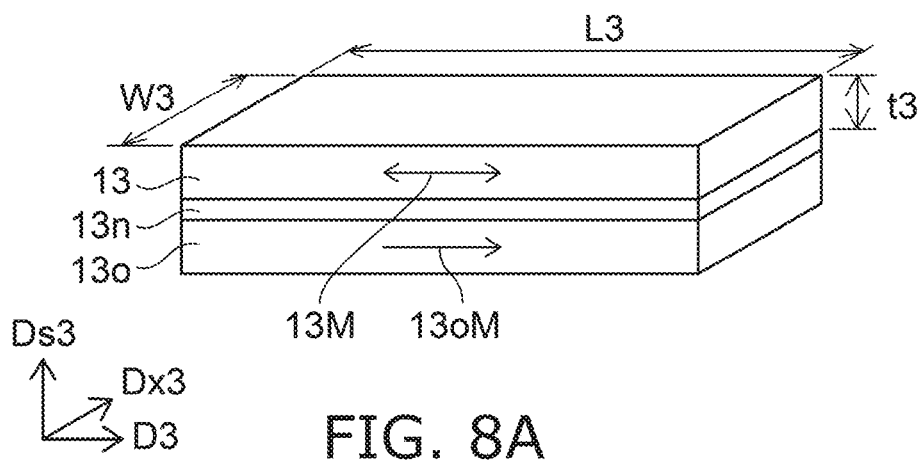
FIGS. 8A and 8B are schematic perspective views illustrating the magnetic sensor according to the third embodiment.
Figure 8B:
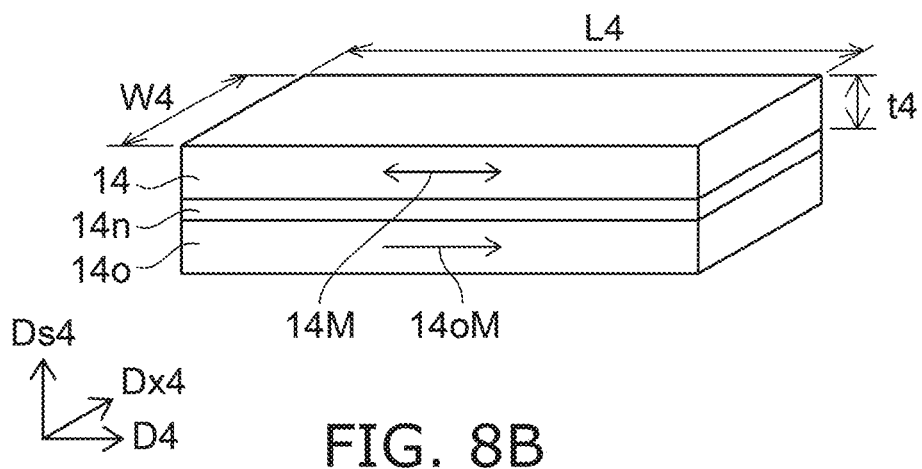

FIGS. 8A and 8B are schematic perspective views illustrating the magnetic sensor according to the third embodiment.

Figure 9:
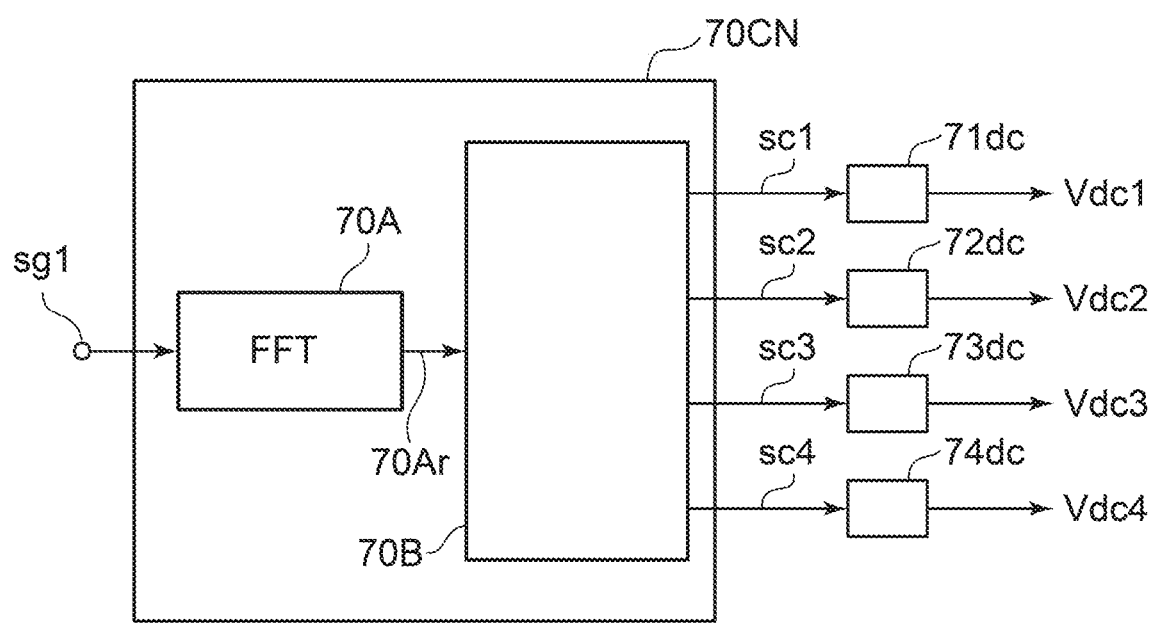
FIG. 9 is a schematic view illustrating a portion of the magnetic sensor according to the third embodiment.

FIG. 9 is a schematic view illustrating a portion of the magnetic sensor according to the third embodiment.

As shown in FIGS. 7A and 7B, the magnetic sensor 130 according to the third embodiment includes the first conductive part circuit 21, the second conductive part circuit 22, a third conductive part circuit 23, a fourth conductive part circuit 24, the alternating current circuit part 75ac, the first direct current circuit part 71dc, the second direct current circuit part 72dc, a third direct current circuit part 73dc, a fourth direct current circuit part 74dc, the first element 51, the second element 52, a third element 53, a fourth element 54, and the detection voltage circuit part 75dc. The configurations described in reference to the second embodiment are applicable to the first conductive part circuit 21, the second conductive part circuit 22, the first element 51, and the second element 52.

For example, as described above, the second conductive part circuit 22 includes the second conductive part 62 that includes the second conductive part end portion 62a and the second conductive part other-end portion 62b, and the second alternating current transfer element 32 electrically connected in series with the second conductive part 62 as shown in FIG. 7A. The second conductive part circuit 22 includes the second circuit end portion 22a and the second circuit other-end portion 22b. The second direct current circuit part 72dc is configured to apply the second direct current voltage Vdc2 between the second conductive part end portion 62a and the second conductive part other-end portion 62b.

As shown in FIG. 7A, the third conductive part circuit 23 includes a third conductive part 63 that includes a third conductive part end portion 63a and a third conductive part other-end portion 63b, and a third alternating current transfer element 33 that is electrically connected in series with the third conductive part 63. The third conductive part circuit 23 includes a third circuit end portion 23a and a third circuit other-end portion 23b. The third direct current circuit part 73dc is configured to apply a third direct current voltage Vdc3 between the third conductive part end portion 63a and the third conductive part other-end portion 63b.

The third alternating current transfer element 33 transfers the alternating current component of the signal and cuts (or attenuates) the direct current component of the signal. The third alternating current transfer element 33 is, for example, a capacitance element. The third alternating current transfer element 33 may include a circuit element including a switching element, etc. In the following example, the third alternating current transfer element 33 is taken as a third switching element.

As shown in FIG. 7A, the fourth conductive part circuit 24 includes a fourth conductive part 64 that includes a fourth conductive part end portion 64a and a fourth conductive part other-end portion 64b, and a fourth alternating current transfer element 34 that is electrically connected in series with the fourth conductive part 64. The fourth conductive part circuit 24 includes a fourth circuit end portion 24a and a fourth circuit other-end portion 24b. The fourth direct current circuit part 74dc is configured to apply a fourth direct current voltage Vdc4 between the fourth conductive part end portion 64a and the fourth conductive part other-end portion 64b.

The fourth alternating current transfer element 34 transfers the alternating current component of the signal and cuts (or attenuates) the direct current component of the signal. The fourth alternating current transfer element 34 is, for example, a capacitance element. The fourth alternating current transfer element 34 may include a circuit element including a switching element, etc. In the following example, the fourth alternating current transfer element 34 is taken as a fourth switching element.

As shown in FIG. 7A, the alternating current circuit part 75ac is configured to apply the alternating current voltage Vac between the first circuit end portion 21a and the first circuit other-end portion 21b, between the second circuit end portion 22a and the second circuit other-end portion 22b, between the third circuit end portion 23a and the third circuit other-end portion 23b, and between the fourth circuit end portion 24a and the fourth circuit other-end portion 24b.

As described above, the second element 52 includes the second magnetic layer 12 (referring to FIG. 5). The third element 53 includes a third magnetic layer 13 (referring to FIG. 8A). The fourth element 54 includes a fourth magnetic layer 14 (referring to FIG. 8B).

As shown in FIG. 7B, the first element 51 and the third element 53 are electrically connected in series to each other. The second element 52 and the fourth element 54 are electrically connected in series to each other. The first element circuit 25a that includes the first element 51 and the third element 53 and the second element circuit 25b that includes the second element 52 and the fourth element 54 are electrically connected in parallel. A bridge circuit (e.g., a Wheatstone bridge) is formed of the first element 51, the second element 52, the third element 53, and the fourth element 54.

As shown in FIG. 7B, the detection voltage circuit part 75dc is configured to apply the detection voltage Vdt to the first and second element circuits 25a and 25b. A detection current (e.g., the first element current Ie1) flows in the first and third elements 51 and 53 due to the detection voltage Vdt. A detection current (e.g., the second element current Ie2) flows in the second and fourth elements 52 and 54 due to the detection voltage Vdt.

As shown in FIG. 7B, the detection circuit part 70DT is configured to output the signal sg1 corresponding to the difference between the potential of the electrical first connection point cp1 of the first and third elements 51 and 53 and the potential of the electrical second connection point cp2 of the second and fourth elements 52 and 54.

FIG. 9 shows an example of the control circuit part 70CN of the magnetic sensor 130. As shown in FIG. 9, the control circuit part 70CN is configured to control at least one of the first direct current voltage Vdc1, the second direct current voltage Vdc2, the third direct current voltage Vdc3, or the fourth direct current voltage Vdc4 based on the signal sg1 output from the detection circuit part 70DT.

The noise that is caused by the asymmetry can be suppressed thereby. The detected magnetic field can be detected with higher precision. According to the embodiment, a magnetic sensor can be provided in which the characteristics can be improved.

The currents, the potentials, and the magnetic fields described in reference to FIGS. 6A to 6F are applicable to the magnetic sensor 130.

As shown in FIG. 7B, the first alternating current Iac1 flows through the first conductive part 61 based on the alternating current voltage Vac. The second alternating current Iac2 flows through the second conductive part 62 based on the alternating current voltage Vac. A third alternating current Iac3 flows through the third conductive part 63 based on the alternating current voltage Vac. A fourth alternating current Iac4 flows through the fourth conductive part 64 based on the alternating current voltage Vac.

FIG. 7B illustrates these alternating currents at one time. For at least one time, a first phase of the first alternating current Iac1 referenced to the orientation of the external magnetic field Hex applied to the first element 51 is the reverse of a second phase of the second alternating current Iac2 referenced to the orientation of the external magnetic field Hex applied to the second element 52. For example, the orientation of the first alternating current magnetic field Ha1 that is based on the first alternating current Lad that has the first phase is the reverse of the orientation of the external magnetic field Hex. For example, the orientation of the second alternating current magnetic field Hat that is based on the second alternating current Iac2 that has the second phase is the same as the orientation of the external magnetic field Hex.

As shown in FIG. 7B, for at least one time, a third phase of the third alternating current Iac3 referenced to the orientation of the external magnetic field Hex applied to the third element 53 is the reverse of a fourth phase of the fourth alternating current Iac4 referenced to the orientation of the external magnetic field Hex applied to the fourth element 54. For example, the orientation of a third alternating current magnetic field Ha1 that is based on the third alternating current Iac3 that has the third phase is the same as the orientation of the external magnetic field Hex. For example, the orientation of a fourth alternating current magnetic field Ha4 that is based on the fourth alternating current Iac4 that has the fourth phase is the reverse of the orientation of the external magnetic field Hex.

For example, the first phase is the same as the fourth phase. For example, the second phase is the same as the third phase. For example, the phase of the first alternating current magnetic field Ha1 is the same as the phase of the fourth alternating current magnetic field Ha4. For example, the phase of the second alternating current magnetic field Ha2 is the same as the phase of the fourth alternating current magnetic field Ha4.

Due to such a reverse phase relationship, the components of 2 times the first frequency f of the changes of the electrical resistances of the first to fourth elements 51 to 54 substantially cancel.

In the embodiment, substantially even-function characteristics are obtained in the first to fourth elements 51 to 54 because the first to fourth direct current voltages Vdc1 to Vdc4 that are applied to the first to fourth conductive parts 61 to 64 can be controlled independently, Thereby, the components of 2 times the first frequency f substantially cancel easily.

As shown in FIG. 7B, the distance between the first element 51 and the first conductive part 61 is less than the distance between the first element 51 and the second conductive part 62, less than the distance between the first element 51 and the third conductive part 63, and less than the distance between the first element 51 and the fourth conductive part 64.

As shown in FIG. 7B, the distance between the second element 52 and the second conductive part 62 is less than the distance between the second element 52 and the first conductive part 61, less than the distance between the second element 52 and the third conductive part 63, and less than the distance between the second element 52 and the fourth conductive part 64.

As shown in FIG. 7B, the distance between the third element 53 and the third conductive part 63 is less than the distance between the third element 53 and the first conductive part 61, less than the distance between the third element 53 and the second conductive part 62, and less than the distance between the third element 53 and the fourth conductive part 64.

As shown in FIG. 7B, the distance between the fourth element 54 and the fourth conductive part 64 is less than the distance between the fourth element 54 and the first conductive part 61, less than the distance between the fourth element 54 and the second conductive part 62, and less than the distance between the fourth element 54 and the third conductive part 63.

The first element 51 includes the first element end portion 51a and the first element other-end portion 51b. The distance between the first element end portion 51a and the first conductive part end portion 61a is less than the distance between the first element end portion 51a and the first conductive part other-end portion 61b. The distance between the first element other-end portion 51b and the first conductive part other-end portion 61b is less than the distance between the first element other-end portion 51b and the first conductive part end portion 61a.

The second element 52 includes the second element end portion 52a and the second element other-end portion 52b. The distance between the second element end portion 52a and the second conductive part end portion 62a is less than the distance between the second element end portion 52a and the second conductive part other-end portion 62b. The distance between the second element other-end portion 52b and the second conductive part other-end portion 62b is less than the distance between the second element other-end portion 52b and the second conductive part end portion 62a.

The third element 53 includes a third element end portion 53a and a third element other-end portion 53b. The distance between the third element end portion 53a and the third conductive part end portion 63a is less than the distance between the third element end portion 53a and the third conductive part other-end portion 63b. The distance between the third element other-end portion 53b and the third conductive part other-end portion 63b is less than the distance between the third element other-end portion 53b and the third conductive part end portion 63a.

The fourth element 54 includes a fourth element end portion 54a and a fourth element other-end portion 54b. The distance between the fourth element end portion 54a and the fourth conductive part end portion 64a is less than the distance between the fourth element end portion 54a and the fourth conductive part other-end portion 64b. The distance between the fourth element other-end portion 54b and the fourth conductive part other-end portion 64b is less than the distance between the fourth element other-end portion 54b and the fourth conductive part end portion 64a.

As described above, the currents, the potentials, and the magnetic fields described in reference to FIGS. 6A to 6F are applicable to the magnetic sensor 130. For example, a voltage similar to that of the second conductive part 62 is applied to the third conductive part 63. For example, a voltage similar to that of the first conductive part 61 is applied to the fourth conductive part 64.

For example, the potential of the first conductive part end portion 61a is greater than the potential of the first conductive part other-end portion 61b at the first time tm1. The potential of the first conductive part end portion 61a is less than the potential of the first conductive part other-end portion 61b at the second time tm2.

The potential of the second conductive part end portion 62a is less than the potential of the second conductive part other-end portion 62b at the first time tm1. The potential of the second conductive part end portion 62a is greater than the potential of the second conductive part other-end portion 62b at the second time tm2.

The potential of the third conductive part end portion 63a is less than the potential of the third conductive part other-end portion 63b at the first time tm1. The potential of the third conductive part end portion 63a is greater than the potential of the third conductive part other-end portion 63b at the second time tm2.

The potential of the fourth conductive part end portion 64a is greater than the potential of the fourth conductive part other-end portion 64b at the first time tm1. The potential of the fourth conductive part end portion 64a is less than the potential of the fourth conductive part other-end portion 64b at the second time tm2.

For example, the first element current Ie1 flows through the first and third elements 51 and 53 based on the detection voltage Vdt applied by the detection voltage circuit part 75dc. The second element current Ie2 flows through the second and fourth elements 52 and 54 based on the detection voltage Vdt. For example, it is sufficient for the first element current Ie1 and the second element current Ie2 to be currents that are substantially direct currents.

For example, the orientation of the current flowing through the first element 51 at the first time tm1 is the same as the orientation of the current flowing through the first element 51 at the second time tm2. The orientation of the current flowing through the second element 52 at the first time tm1 is the same as the orientation of the current flowing through the second element 52 at the second time tm2. The orientation of the current flowing through the third element 53 at the first time tm1 is the same as the orientation of the current flowing through the third element 53 at the second time tm2. The orientation of the current flowing through the fourth element 54 at the first time tm1 is the same as the orientation of the current flowing through the fourth element 54 at the second time tm2.

By such a configuration, characteristics of reverse phases are obtained in the first and second elements 51 and 52. Characteristics of reverse phases are obtained in the third and fourth elements 53 and 54.

In one example as shown in FIG. 7A, the direction from the third conductive part other-end portion 63b toward the third conductive part end portion 63a is along a third direction D3. In the example, the third direction D3 is along the first direction D1.

As shown in FIG. 8A, the length along the third direction D3 of the third magnetic layer 13 is taken as a length L3. The length along a third cross direction Dx3 of the third magnetic layer 13 is taken as a length W3. The third cross direction Dx3 crosses the third direction D3. The length along a third other direction Ds3 of the third magnetic layer 13 is taken as a length t3. The third other direction Ds3 crosses a plane including the third direction D3 and the third cross direction Dx3. In one example, for example, the third direction D3 is along the X-axis direction. For example, the third cross direction Dx3 is along the Y-axis direction. For example, the third other direction Ds3 is along the Z-axis direction.

For example, the length L3 is greater than the length W3. The length W3 is greater than the length t3. Due to such a length relationship, a magnetization 13M of the third magnetic layer 13 is easily along the third direction D3. An even-function characteristic is easily obtained.

As shown in FIG. 8A, the third element 53 includes, for example, the third magnetic layer 13, a third counter magnetic layer 13o, and a third nonmagnetic layer 13n. The third nonmagnetic layer 13n is provided between the third magnetic layer 13 and the third counter magnetic layer 13o. For example, the magnetization 13M of the third magnetic layer 13 is along a magnetization 13oM of the third counter magnetic layer 13o when there is substantially no external magnetic field.

In one example as shown in FIG. 7A, the direction from the fourth conductive part other-end portion 64b toward the fourth conductive part end portion 64a is along a fourth direction D4. In the example, the fourth direction D4 is along the first direction D1.

As shown in FIG. 8B, the length along the fourth direction D4 of the fourth magnetic layer 14 is taken as a length L4. The length along a fourth cross direction Dx4 of the fourth magnetic layer 14 is taken as a length W4. The fourth cross direction Dx4 crosses the fourth direction D4. The length along a fourth other direction Ds4 of the fourth magnetic layer 14 is taken as a length t4. The fourth other direction Ds4 crosses a plane including the fourth direction D4 and the fourth cross direction Dx4. In one example, for example, the fourth direction D4 is along the X-axis direction. For example, the fourth cross direction Dx4 is along the Y-axis direction. For example, the fourth other direction Ds4 is along the Z-axis direction.

For example, the length L4 is greater than the length W4. The length W4 is greater than the length t4. Due to such a length relationship, a magnetization 14M of the fourth magnetic layer 14 is easily along the fourth direction D4. An even-function characteristic is easily obtained.

As shown in FIG. 8B, the fourth element 54 includes, for example, the fourth magnetic layer 14, a fourth counter magnetic layer 14o, and a fourth nonmagnetic layer 14n. The fourth nonmagnetic layer 14n is provided between the fourth magnetic layer 14 and the fourth counter magnetic layer 14o. For example, the magnetization 14M of the fourth magnetic layer 14 is along a magnetization 14oM of the fourth counter magnetic layer 14o when there is substantially no external magnetic field.

In one example as shown in FIG. 9, the control circuit part 70CN includes a first control circuit 70A and a second control circuit 70B. The first control circuit 70A outputs a result 70Ar of performing a Fourier transform of the signal sg1 output from the detection circuit part 70DT. The first control circuit 70A is, for example, a FFT circuit.

Based on the result 70Ar output from the first control circuit 70A, the second control circuit 70B supplies a control signal (e.g., the first to fourth control signals sc1 to sc4, etc.) to at least one of the first direct current circuit part 71dc, the second direct current circuit part 72dc, the third direct current circuit part 73dc, or the fourth direct current circuit part 74dc. The second control circuit 70B is, for example, an arithmetic circuit. For example, the second control circuit 70B is configured to output a control signal to reduce the first frequency f1 component of the signal sg1 output from the detection circuit part 70DT when there is substantially no external magnetic field.

Such a configuration relating to the control circuit part 70CN is applicable to the second and third embodiments. The control circuit part 70CN is configured to output a control signal to reduce the first frequency f1 component of the signal sg1 output from the detection circuit part 70DT when there is substantially no external magnetic field.

In the embodiment, the first to fourth direct current voltages Vdc1 to Vdc4 are controlled by control signals (e.g., the first to fourth control signals sc1 to sc4, etc.). The control may be a feedback control. For example, the first to fourth direct current voltages Vdc1 to Vdc4 may be controlled continuously. For example, an abrupt change of the external magnetic field may be detected.

In the embodiment, the frequency (the first frequency f1) of the alternating current voltage Vac is, for example, not less than 1 kHz and not more than 100 kHz.

The embodiments may include the following configurations (e.g., technological proposals).

Configuration 1

A magnetic sensor, comprising:
a first conductive part circuit including a first circuit end portion and a first circuit other-end portion, and including
  a first conductive part including a first conductive part end portion and a first conductive part other-end portion, and
  a first alternating current transfer element electrically connected in series with the first conductive part;
an alternating current circuit part configured to apply an alternating current voltage between the first circuit end portion and the first circuit other-end portion;
a first direct current circuit part configured to apply a first direct current voltage to the first conductive part end portion and the first conductive part other-end portion; and
a first element including a first magnetic layer.

Configuration 2

The magnetic sensor according to Configuration 1, wherein
a first electrical resistance of the first element increases as an absolute value of a first current flowing in the first conductive part increases when the first current is positive, and
the first electrical resistance increases as the absolute value of the first current flowing in the first conductive part increases when the first current is negative.

Configuration 3

The magnetic sensor according to Configuration 2, further comprising:
a detection circuit part configured to output a signal corresponding to the first electrical resistance.

Configuration 4

The magnetic sensor according to Configuration 3, further comprising:
a control circuit part,
the control circuit part being configured to control the first direct current voltage to cause the first electrical resistance to approach an even function of the first current based on the signal output from the detection circuit part.

Configuration 5

The magnetic sensor according to Configuration 3, further comprising:
a control circuit part,
the alternating current voltage having a first frequency,
the control circuit part being configured to control the first direct current voltage to reduce a component of the first frequency of the signal output from the detection circuit part when there is substantially no external magnetic field.

Configuration 6

The magnetic sensor according to any one of Configurations 1 to 5, wherein
a direction from the first conductive part end portion toward the first conductive part other-end portion is along a first direction,
a length along the first direction of the first magnetic layer is greater than a length along a first cross direction of the first magnetic layer, the first cross direction crossing the first direction, and
the length along the first cross direction of the first magnetic layer is greater than a length along a first other direction of the first magnetic layer, the first other direction crossing a plane including the first direction and the first cross direction.

Configuration 7

The magnetic sensor according to any one of Configurations 1 to 6, wherein
the first element includes:
a first counter magnetic layer; and
a first nonmagnetic layer provided between the first magnetic layer and the first counter magnetic layer.

Configuration 8

The magnetic sensor according to Configuration 1, further comprising:
a second conductive part circuit including a second circuit end portion and a second circuit other-end portion, and including
a second conductive part including a second conductive part end portion and a second conductive part other-end portion, and
a second alternating current transfer element electrically connected in series with the second conductive part;
a second direct current circuit part configured to apply a second direct current voltage between the second conductive part end portion and the second conductive part other-end portion;
a second element including a second magnetic layer;
a first resistance element;
a second resistance element; and
a detection voltage circuit part,
the alternating current circuit part also being configured to apply the alternating current voltage between the second circuit end portion and the second circuit other-end portion,
the first element, the first resistance element, the second element, and the second resistance element forming a bridge circuit,
the detection voltage circuit part being configured to apply a detection voltage to the bridge circuit,
the detection circuit part being configured to output a signal corresponding to a difference between a potential of an electrical first connection point of the first element and the first resistance element and a potential of an electrical second connection point of the second element and the second resistance element,
the control circuit part being configured to control at least one of the first direct current voltage or the second direct current voltage based on the signal output from the detection circuit part.

Configuration 9

The magnetic sensor according to Configuration 8, wherein
the first resistance element is electrically connected in series with the first element,
the second resistance element is electrically connected in series with the second element,
a first element circuit includes the first element and the first resistance element,
a second element circuit includes the second element and the second resistance element,
the first element circuit and the second element circuit are electrically connected in parallel, and
the detection voltage circuit part applies the detection voltage to the first and second element circuits.

Configuration 10

The magnetic sensor according to Configuration 8 or 9, wherein
a first alternating current flows through the first conductive part based on the alternating current voltage,
a second alternating current flows through the second conductive part based on the alternating current voltage, and
for at least one time, a phase of the first alternating current referenced to an orientation of an external magnetic field applied to the first element is a reverse of a phase of the second alternating current referenced to an orientation of the external magnetic field applied to the second element.

Configuration 11

The magnetic sensor according to Configuration 8 or 9, wherein
a distance between the first conductive part and the first element is less than a distance between the first conductive part and the second element,
a distance between the second conductive part and the second element is less than a distance between the second conductive part and the first element,
the first element includes a first element end portion and a first element other-end portion,
a distance between the first element end portion and the first conductive part end portion is less than a distance between the first element end portion and the first conductive part other-end portion,
a distance between the first element other-end portion and the first conductive part other-end portion is less than a distance between the first element other-end portion and the first conductive part end portion,
the second element includes a second element end portion and a second element other-end portion,
a distance between the second element end portion and the second conductive part end portion is less than a distance between the second element end portion and the second conductive part other-end portion,
a distance between the second element other-end portion and the second conductive part other-end portion is less than a distance between the second element other-end portion and the second conductive part end portion,
a potential of the first conductive part end portion is greater than a potential of the first conductive part other-end portion at a first time,
the potential of the first conductive part end portion is less than the potential of the first conductive part other-end portion at a second time, a potential of the second conductive part end portion is less than a potential of the second conductive part other-end portion at the first time, the potential of the second conductive part end portion is greater than the potential of the second conductive part other-end portion at the second time, an orientation of a current flowing through the first element at the first time is the same as an orientation of a current flowing through the first element at the second time, and an orientation of a current flowing through the second element at the first time is the same as an orientation of a current flowing through the second element at the second time.

Configuration 12

The magnetic sensor according to Configuration 11, wherein the current flows through the first element from the first element end portion toward the first element other-end portion at the first and second times, and the current flows through the second element from the second element end portion toward the second element other-end portion at the first and second times.

Configuration 13

The magnetic sensor according to any one of Configurations 6 to 12, wherein a direction from the second conductive part other-end portion toward the second conductive part end portion is along a second direction, a length along the second direction of the second magnetic layer is greater than a length along a second cross direction of the second magnetic layer, the second cross direction crossing the second direction, and the length along the second cross direction of the second magnetic layer is greater than a length along a second other direction of the second magnetic layer, the second other direction crossing a plane including the second direction and the second cross direction.

Configuration 14

The magnetic sensor according to Configuration 1, further comprising:

a second conductive part circuit including a second circuit end portion and a second circuit other-end portion, and including a second conductive part including a second conductive part end portion and a second conductive part other-end portion, and a second alternating current transfer element electrically connected in series with the second conductive part;

a second direct current circuit part configured to apply a second direct current voltage between the second conductive part end portion and the second conductive part other-end portion;

a second element including a second magnetic layer;

a third conductive part circuit including a third circuit end portion and a third circuit other-end portion, and including a third conductive part including a third conductive part end portion and a third conductive part other-end portion, and a third alternating current transfer element electrically connected in series with the third conductive part;

a third direct current circuit part configured to apply a third direct current voltage between the third conductive part end portion and the third conductive part other-end portion;

a third element including a third magnetic layer;

a fourth conductive part circuit including a fourth circuit end portion and a fourth circuit other-end portion, and including a fourth conductive part including a fourth conductive part end portion and a fourth conductive part other-end portion, and a fourth alternating current transfer element electrically connected in series with the fourth conductive part;

a fourth direct current circuit part configured to apply a fourth direct current voltage between the fourth conductive part end portion and the fourth conductive part other-end portion;

a fourth element including a fourth magnetic layer;

a detection voltage circuit part;

a detection circuit part; and a control circuit part, the alternating current circuit part also being configured to apply the alternating current voltage between the second circuit end portion and the second circuit other-end portion, between the third circuit end portion and the third circuit other-end portion, and between the fourth circuit end portion and the fourth circuit other-end portion, the first element and the third element being electrically connected to each other, the second element and the fourth element being electrically connected to each other, a first element circuit including the first and third elements, a second element circuit including the second and fourth elements, the first element circuit and the second element circuit being electrically connected in parallel, the detection voltage circuit part being configured to apply a detection voltage to the first and second element circuits, the detection circuit part being configured to output a signal corresponding to a difference between a potential of an electrical first connection point of the first and third elements and a potential of an electrical second connection point of the second and fourth elements, the control circuit part being configured to control at least one of the first direct current voltage, the second direct current voltage, the third direct current voltage, or the fourth direct current voltage based on the signal output from the detection circuit part.

Configuration 15

The magnetic sensor according to Configuration 14, wherein a first alternating current flows through the first conductive part based on the alternating current voltage, a second alternating current flows through the second conductive part based on the alternating current voltage, a third alternating current flows through the third conductive part based on the alternating current voltage, a fourth alternating current flows through the fourth conductive part based on the alternating current voltage, for at least one time, a first phase of the first alternating current referenced to an orientation of an external magnetic field applied to the first element is a reverse of a second phase of the second alternating current referenced to an orientation of the external magnetic field applied to the second element, and for at least one time, a third phase of the third alternating current referenced to an orientation of an external magnetic field applied to the third element is a reverse of a fourth phase of the fourth alternating current referenced to an orientation of the external magnetic field applied to the fourth element.

Configuration 16

The magnetic sensor according to Configuration 15, wherein the first phase is the same as the fourth phase, and the second phase is the same as the third phase.

Configuration 17

The magnetic sensor according to any one of Configurations 14 to 16, wherein a distance between the first element and the first conductive part is less than a distance between the first element and the second conductive part, less than a distance between the first element and the third conductive part, and less than a distance between the first element and the fourth conductive part, a distance between the second element and the second conductive part is less than a distance between the second element and the first conductive part, less than a distance between the second element and the third conductive part, and less than a distance between the second element and the fourth conductive part, a distance between the third element and the third conductive part is less than a distance between the third element and the first conductive part, less than a distance between the third element and the second conductive part, and less than a distance between the third element and the fourth conductive part, a distance between the fourth element and the fourth conductive part is less than a distance between the fourth element and the first conductive part, less than a distance between the fourth element and the second conductive part, and less than a distance between the fourth element and the third conductive part, the first element includes a first element end portion and a first element other-end portion, a distance between the first element end portion and the first conductive part end portion is less than a distance between the first element end portion and the first conductive part other-end portion, a distance between the first element other-end portion and the first conductive part other-end portion is less than a distance between the first element other-end portion and the first conductive part end portion, the second element includes a second element end portion and a second element other-end portion, a distance between the second element end portion and the second conductive part end portion is less than a distance between the second element end portion and the second conductive part other-end portion, a distance between the second element other-end portion and the second conductive part other-end portion is less than a distance between the second element other-end portion and the second conductive part end portion, the third element includes a third element end portion and a third element other-end portion, a distance between the third element end portion and the third conductive part end portion is less than a distance between the third element end portion and the third conductive part other-end portion, a distance between the third element other-end portion and the third conductive part other-end portion is less than a distance between the third element other-end portion and the third conductive part end portion, the fourth element includes a fourth element end portion and a fourth element other-end portion, a distance between the fourth element end portion and the fourth conductive part end portion is less than a distance between the fourth element end portion and the fourth conductive part other-end portion, a distance between the fourth element other-end portion and the fourth conductive part other-end portion is less than a distance between the fourth element other-end portion and the fourth conductive part end portion, a potential of the first conductive part end portion is greater than a potential of the first conductive part other-end portion at a first time, the potential of the first conductive part end portion is less than the potential of the first conductive part other-end portion at a second time, a potential of the second conductive part end portion is less than a potential of the second conductive part other-end portion at the first time, the potential of the second conductive part end portion is greater than the potential of the second conductive part other-end portion at the second time, a potential of the third conductive part end portion is less than a potential of the third conductive part other-end portion at the first time, the potential of the third conductive part end portion is greater than the potential of the third conductive part other-end portion at the second time, a potential of the fourth conductive part end portion is greater than a potential of the fourth conductive part other-end portion at the first time, the potential of the fourth conductive part end portion is less than the potential of the fourth conductive part other-end portion at the second time, an orientation of a current flowing through the first element at the first time is the same as an orientation of a current flowing through the first element at the second time, an orientation of a current flowing through the second element at the first time is the same as an orientation of a current flowing through the second element at the second time, an orientation of a current flowing through the third element at the first time is the same as an orientation of a current flowing through the third element at the second time, and an orientation of a current flowing through the fourth element at the first time is the same as an orientation of a current flowing through the fourth element at the second time.

Configuration 18

The magnetic sensor according to any one of Configurations 14 to 17, wherein the control circuit part includes:

a first control circuit outputting a result of a Fourier transform of the signal output from the detection circuit part; and a second control circuit supplying a control signal to at least one of the first direct current circuit part, the second direct current circuit part, the third direct current circuit part, or the fourth direct current circuit part based on the result output from the first control circuit.

Configuration 19

The magnetic sensor according to any one of Configurations 8 to 18, wherein the alternating current voltage has a first frequency, and the control circuit part is configured to output a control signal to reduce a component of the first frequency of the signal output from the detection circuit part when there is substantially no external magnetic field.

Configuration 20

The magnetic sensor according to any one of Configurations 14 to 19, wherein
a direction from the third conductive part other-end portion toward the third conductive part end portion is along a third direction,
a length along the third direction of the third magnetic layer is greater than a length along a third cross direction of the third magnetic layer, the third cross direction crossing the third direction,
the length along the third cross direction of the third magnetic layer is greater than a length along a third other direction of the third magnetic layer, the third other direction crossing a plane including the third direction and the third cross direction,
a direction from the fourth conductive part other-end portion toward the fourth conductive part end portion is along a fourth direction,
a length along the fourth direction of the fourth magnetic layer is greater than a length along a fourth cross direction of the fourth magnetic layer, the fourth cross direction crossing the fourth direction, and
the length along the fourth cross direction of the fourth magnetic layer is greater than a length along a fourth other direction of the fourth magnetic layer, the fourth other direction crossing a plane including the fourth direction and the fourth cross direction.

According to the embodiments, a magnetic sensor can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic sensors such as magnetic layers, nonmagnetic layers, conductive parts, circuits, alternating current transfer elements, circuit parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic sensors practicable by an appropriate design modification by one skilled in the art based on the magnetic sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic sensor, comprising:
a first conductive part circuit including a first circuit end portion and a first circuit other-end portion, and including
a first conductive part including a first conductive part end portion and a first conductive part other-end portion, and
a first alternating current transfer element electrically connected in series with the first conductive part;
an alternating current circuit part configured to apply an alternating current voltage between the first circuit end portion and the first circuit other-end portion;
a first direct current circuit part configured to apply a first direct current voltage to the first conductive part end portion and the first conductive part other-end portion;
a first element including a first magnetic layer;
a detection circuit part; and
a control circuit part,
wherein
a first electrical resistance of the first element increases as an absolute value of a first current flowing in the first conductive part increases when the first current is positive,
the first electrical resistance increases as the absolute value of the first current flowing in the first conductive part increases when the first current is negative,
the detection circuit part is configured to output a signal corresponding to the first electrical resistance, and
the control circuit part is configured to control the first direct current voltage to cause the first electrical resistance to approach an even function of the first current based on the signal output from the detection circuit part.

2. A magnetic sensor, comprising:
a first conductive part circuit including a first circuit end portion and a first circuit other-end portion, and including
a first conductive part including a first conductive part end portion and a first conductive part other-end portion, and
a first alternating current transfer element electrically connected in series with the first conductive part;
an alternating current circuit part configured to apply an alternating current voltage between the first circuit end portion and the first circuit other-end portion;
a first direct current circuit part configured to apply a first direct current voltage to the first conductive part end portion and the first conductive part other-end portion;
a first element including a first magnetic layer;
a detection circuit part; and
a control circuit part,
wherein
a first electrical resistance of the first element increases as an absolute value of a first current flowing in the first conductive part increases when the first current is positive,
the first electrical resistance increases as the absolute value of the first current flowing in the first conductive part increases when the first current is negative,
the detection circuit part is configured to output a signal corresponding to the first electrical resistance,
the alternating current voltage has a first frequency, and
the control circuit part is configured to control the first direct current voltage to reduce a component of the first frequency of the signal output from the detection circuit part when there is substantially no external magnetic field.

3. The sensor according to claim 1, wherein
a direction from the first conductive part end portion toward the first conductive part other-end portion is along a first direction,
a length of the first magnetic layer along the first direction is greater than a length of the first magnetic layer along a first cross direction, wherein the first cross direction crosses the first direction, and
the length of the first magnetic layer along the first cross direction is greater than a length of the first magnetic layer along a first other direction, the first other direction crosses a plane including the first direction and the first cross direction.

4. The sensor according to claim 1, wherein
the first element includes:
a first counter magnetic layer; and
a first nonmagnetic layer provided between the first magnetic layer and the first counter magnetic layer.

5. A magnetic sensor, comprising:
a first conductive part circuit including a first circuit end portion and a first circuit other-end portion, and including
a first conductive part including a first conductive part end portion and a first conductive part other-end portion, and
a first alternating current transfer element electrically connected in series with the first conductive part;
an alternating current circuit part configured to apply an alternating current voltage between the first circuit end portion and the first circuit other-end portion;
a first direct current circuit part configured to apply a first direct current voltage to the first conductive part end portion and the first conductive part other-end portion;
a first element including a first magnetic layer;
a second conductive part circuit including a second circuit end portion and a second circuit other-end portion, and including
a second conductive part including a second conductive part end portion and a second conductive part other-end portion, and
a second alternating current transfer element electrically connected in series with the second conductive part;
a second direct current circuit part configured to apply a second direct current voltage between the second conductive part end portion and the second conductive part other-end portion;
a second element including a second magnetic layer;
a first resistance element;
a second resistance element; and
a detection voltage circuit part,
the alternating current circuit part also being configured to apply the alternating current voltage between the second circuit end portion and the second circuit other-end portion,
the first element, the first resistance element, the second element, and the second resistance element forming a bridge circuit,
the detection voltage circuit part being configured to apply a detection voltage to the bridge circuit,
the detection circuit part being configured to output a signal corresponding to a difference between a potential of an electrical first connection point of the first element and the first resistance element and a potential of an electrical second connection point of the second element and the second resistance element,
the control circuit part being configured to control at least one of the first direct current voltage or the second direct current voltage based on the signal output from the detection circuit part.

6. The sensor according to claim 5, wherein
the first resistance element is electrically connected in series with the first element,
the second resistance element is electrically connected in series with the second element,
a first element circuit includes the first element and the first resistance element,
a second element circuit includes the second element and the second resistance element,
the first element circuit and the second element circuit are electrically connected in parallel, and
the detection voltage circuit part applies the detection voltage to the first and second element circuits.

7. The sensor according to claim 5, wherein
a first alternating current flows through the first conductive part based on the alternating current voltage,
a second alternating current flows through the second conductive part based on the alternating current voltage, and
for at least one time, a phase of the first alternating current referenced to an orientation of an external magnetic field applied to the first element is a reverse of a phase of the second alternating current referenced to an orientation of the external magnetic field applied to the second element.

8. The sensor according to claim 5, wherein
a distance between the first conductive part and the first element is less than a distance between the first conductive part and the second element,
a distance between the second conductive part and the second element is less than a distance between the second conductive part and the first element,
the first element includes a first element end portion and a first element other-end portion,
a distance between the first element end portion and the first conductive part end portion is less than a distance between the first element end portion and the first conductive part other-end portion,
a distance between the first element other-end portion and the first conductive part other-end portion is less than a distance between the first element other-end portion and the first conductive part end portion,
the second element includes a second element end portion and a second element other-end portion,
a distance between the second element end portion and the second conductive part end portion is less than a distance between the second element end portion and the second conductive part other-end portion,
a distance between the second element other-end portion and the second conductive part other-end portion is less than a distance between the second element other-end portion and the second conductive part end portion,
a potential of the first conductive part end portion is greater than a potential of the first conductive part other-end portion at a first time,
the potential of the first conductive part end portion is less than the potential of the first conductive part other-end portion at a second time,
a potential of the second conductive part end portion is less than a potential of the second conductive part other-end portion at the first time, the potential of the second conductive part end portion is greater than the potential of the second conductive part other-end portion at the second time, an orientation of a current flowing through the first element at the first time is the same as an orientation of a current flowing through the first element at the second time, and an orientation of a current flowing through the second element at the first time is the same as an orientation of a current flowing through the second element at the second time.

9. The sensor according to claim 8, wherein
the current flows through the first element from the first element end portion toward the first element other-end portion at the first and second times, and
the current flows through the second element from the second element end portion toward the second element other-end portion at the first and second times.

10. The sensor according to claim 3, wherein
a direction from the second conductive part other-end portion toward the second conductive part end portion is along a second direction,
a length of the second magnetic layer along the second direction is greater than a length of the second magnetic layer along a second cross direction, the second cross direction crosses the second direction, and
the length of the second magnetic layer along the second cross direction is greater than a length of the second magnetic layer along a second other direction, the second other direction crosses a plane including the second direction and the second cross direction.

11. A magnetic sensor, comprising:
a first conductive part circuit including a first circuit end portion and a first circuit other-end portion, and including
 a first conductive part including a first conductive part end portion and a first conductive part other-end portion, and
 a first alternating current transfer element electrically connected in series with the first conductive part;
an alternating current circuit part configured to apply an alternating current voltage between the first circuit end portion and the first circuit other-end portion;
a first direct current circuit part configured to apply a first direct current voltage to the first conductive part end portion and the first conductive part other-end portion;
a first element including a first magnetic layer;
a second conductive part circuit including a second circuit end portion and a second circuit other-end portion, and including
 a second conductive part including a second conductive part end portion and a second conductive part other-end portion, and
 a second alternating current transfer element electrically connected in series with the second conductive part;
a second direct current circuit part configured to apply a second direct current voltage between the second conductive part end portion and the second conductive part other-end portion;
a second element including a second magnetic layer;
a third conductive part circuit including a third circuit end portion and a third circuit other-end portion, and including
 a third conductive part including a third conductive part end portion and a third conductive part other-end portion, and
 a third alternating current transfer element electrically connected in series with the third conductive part;
a third direct current circuit part configured to apply a third direct current voltage between the third conductive part end portion and the third conductive part other-end portion;
a third element including a third magnetic layer;
a fourth conductive part circuit including a fourth circuit end portion and a fourth circuit other-end portion, and including
 a fourth conductive part including a fourth conductive part end portion and a fourth conductive part other-end portion, and
 a fourth alternating current transfer element electrically connected in series with the fourth conductive part;
a fourth direct current circuit part configured to apply a fourth direct current voltage between the fourth conductive part end portion and the fourth conductive part other-end portion;
a fourth element including a fourth magnetic layer;
a detection voltage circuit part;
a detection circuit part; and
a control circuit part,
the alternating current circuit part also being configured to apply the alternating current voltage between the second circuit end portion and the second circuit other-end portion, between the third circuit end portion and the third circuit other-end portion, and between the fourth circuit end portion and the fourth circuit other-end portion,
the first element and the third element being electrically connected to each other,
the second element and the fourth element being electrically connected to each other,
a first element circuit including the first and third elements,
a second element circuit including the second and fourth elements,
the first element circuit and the second element circuit being electrically connected in parallel,
the detection voltage circuit part being configured to apply a detection voltage to the first and second element circuits,
the detection circuit part being configured to output a signal corresponding to a difference between a potential of an electrical first connection point of the first and third elements and a potential of an electrical second connection point of the second and fourth elements,
the control circuit part being configured to control at least one of the first direct current voltage, the second direct current voltage, the third direct current voltage, or the fourth direct current voltage based on the signal output from the detection circuit part.

12. The sensor according to claim 11, wherein
a first alternating current flows through the first conductive part based on the alternating current voltage,
a second alternating current flows through the second conductive part based on the alternating current voltage,
a third alternating current flows through the third conductive part based on the alternating current voltage,
a fourth alternating current flows through the fourth conductive part based on the alternating current voltage,
for at least one time, a first phase of the first alternating current referenced to an orientation of an external magnetic field applied to the first element is a reverse of a second phase of the second alternating current referenced to an orientation of the external magnetic field applied to the second element, and for at least one time, a third phase of the third alternating current referenced to an orientation of an external magnetic field applied to the third element is a reverse of a fourth phase of the fourth alternating current referenced to an orientation of the external magnetic field applied to the fourth element.

13. The sensor according to claim 12, wherein
the first phase is the same as the fourth phase, and
the second phase is the same as the third phase.

14. The sensor according to claim 11, wherein
a distance between the first element and the first conductive part is less than a distance between the first element and the second conductive part, less than a distance between the first element and the third conductive part, and less than a distance between the first element and the fourth conductive part, a distance between the second element and the second conductive part is less than a distance between the second element and the first conductive part, less than a distance between the second element and the third conductive part, and less than a distance between the second element and the fourth conductive part, a distance between the third element and the third conductive part is less than a distance between the third element and the first conductive part, less than a distance between the third element and the second conductive part, and less than a distance between the third element and the fourth conductive part, a distance between the fourth element and the fourth conductive part is less than a distance between the fourth element and the first conductive part, less than a distance between the fourth element and the second conductive part, and less than a distance between the fourth element and the third conductive part, the first element includes a first element end portion and a first element other-end portion, a distance between the first element end portion and the first conductive part end portion is less than a distance between the first element end portion and the first conductive part other-end portion, a distance between the first element other-end portion and the first conductive part other-end portion is less than a distance between the first element other-end portion and the first conductive part end portion, the second element includes a second element end portion and a second element other-end portion, a distance between the second element end portion and the second conductive part end portion is less than a distance between the second element end portion and the second conductive part other-end portion, a distance between the second element other-end portion and the second conductive part other-end portion is less than a distance between the second element other-end portion and the second conductive part end portion, the third element includes a third element end portion and a third element other-end portion, a distance between the third element end portion and the third conductive part end portion is less than a distance between the third element end portion and the third conductive part other-end portion, a distance between the third element other-end portion and the third conductive part other-end portion is less than a distance between the third element other-end portion and the third conductive part end portion, the fourth element includes a fourth element end portion and a fourth element other-end portion, a distance between the fourth element end portion and the fourth conductive part end portion is less than a distance between the fourth element end portion and the fourth conductive part other-end portion, a distance between the fourth element other-end portion and the fourth conductive part other-end portion is less than a distance between the fourth element other-end portion and the fourth conductive part end portion, a potential of the first conductive part end portion is greater than a potential of the first conductive part other-end portion at a first time, the potential of the first conductive part end portion is less than the potential of the first conductive part other-end portion at a second time, a potential of the second conductive part end portion is less than a potential of the second conductive part other-end portion at the first time, the potential of the second conductive part end portion is greater than the potential of the second conductive part other-end portion at the second time, a potential of the third conductive part end portion is less than a potential of the third conductive part other-end portion at the first time, the potential of the third conductive part end portion is greater than the potential of the third conductive part other-end portion at the second time, a potential of the fourth conductive part end portion is greater than a potential of the fourth conductive part other-end portion at the first time, the potential of the fourth conductive part end portion is less than the potential of the fourth conductive part other-end portion at the second time, an orientation of a current flowing through the first element at the first time is the same as an orientation of a current flowing through the first element at the second time, an orientation of a current flowing through the second element at the first time is the same as an orientation of a current flowing through the second element at the second time, an orientation of a current flowing through the third element at the first time is the same as an orientation of a current flowing through the third element at the second time, and an orientation of a current flowing through the fourth element at the first time is the same as an orientation of a current flowing through the fourth element at the second time.

15. The sensor according to claim 11, wherein
the control circuit part includes:
a first control circuit outputting a result of a Fourier transform of the signal output from the detection circuit part; and
a second control circuit supplying a control signal to at least one of the first direct current circuit part, the second direct current circuit part, the third direct current circuit part, or the fourth direct current circuit part based on the result output from the first control circuit.

16. The sensor according to claim 5, wherein
the alternating current voltage has a first frequency, and
the control circuit part is configured to output a control signal to reduce a component of the first frequency of the signal output from the detection circuit part when there is substantially no external magnetic field.

17. The sensor according to claim 11, wherein
a direction from the third conductive part other-end portion toward the third conductive part end portion is along a third direction,
a length along the third direction of the third magnetic layer is greater than a length along a third cross direction of the third magnetic layer, the third cross direction crossing the third direction,
the length along the third cross direction of the third magnetic layer is greater than a length along a third other direction of the third magnetic layer, the third other direction crossing a plane including the third direction and the third cross direction,
a direction from the fourth conductive part other-end portion toward the fourth conductive part end portion is along a fourth direction,
a length along the fourth direction of the fourth magnetic layer is greater than a length along a fourth cross direction of the fourth magnetic layer, the fourth cross direction crossing the fourth direction, and
the length along the fourth cross direction of the fourth magnetic layer is greater than a length along a fourth other direction of the fourth magnetic layer, the fourth other direction crossing a plane including the fourth direction and the fourth cross direction.

* * * * *